(12) United States Patent
Hurrell

(10) Patent No.: US 8,552,897 B1
(45) Date of Patent: Oct. 8, 2013

(54) REFERENCE CIRCUIT SUITABLE FOR USE WITH AN ANALOG TO DIGITAL CONVERTER AND AN ANALOG TO DIGITAL CONVERTER INCLUDING SUCH A REFERENCE CIRCUIT

(75) Inventor: Christopher Peter Hurrell, Cookham (GB)

(73) Assignee: Analog Devices, Inc., Norwood, MA (US)

( * ) Notice: Subject to any disclaimer, the term of this patent is extended or adjusted under 35 U.S.C. 154(b) by 8 days.

(21) Appl. No.: 13/427,730

(22) Filed: Mar. 22, 2012

(51) Int. Cl.
*H03M 1/66* (2006.01)
(52) U.S. Cl.
USPC .......................................... 341/150; 341/136
(58) Field of Classification Search
USPC ................. 341/136, 155, 172, 156, 150, 161, 341/162, 163; 327/530, 51, 64
See application file for complete search history.

(56) References Cited

U.S. PATENT DOCUMENTS

| 5,621,409 | A | 4/1997 | Cotter et al. |
| 5,684,487 | A | 11/1997 | Timko |
| 6,828,927 | B1 | 12/2004 | Hurrell et al. |
| 7,154,423 | B2 * | 12/2006 | Kondo ........................... 341/136 |

| 2003/0063026 | A1 | 4/2003 | Nandy |
| 2006/0001563 | A1 | 1/2006 | Kearney |
| 2007/0109168 | A1 | 5/2007 | Hennessy et al. |
| 2008/0129573 | A1 | 6/2008 | Mueck et al. |
| 2011/0260708 | A1 | 10/2011 | Trifonov et al. |

FOREIGN PATENT DOCUMENTS

EP 0809889 B1 7/2001

OTHER PUBLICATIONS

International Search Report and Written Opinion of the International Searching Authority in counterpart international application No. PCT/US2013/032905, report dated Jun. 14, 2013.

* cited by examiner

*Primary Examiner* — Joseph Lauture
(74) *Attorney, Agent, or Firm* — Kenyon & Kenyon LLP

(57) ABSTRACT

A reference circuit for use with a charge redistribution analog to digital converter, having a capacitor array, the reference circuit comprising: an input for receiving a signal; an output for supplying a reference voltage to at least one capacitor of the charge redistribution capacitor array; a storage capacitor for storing the reference voltage; a voltage modification circuit for comparing the reference voltage stored on the storage capacitor with the reference signal, and based on the comparison to supply a correction so as to reduce a difference between the reference voltage and the reference signal, the correction being applied during a correction phase; and a first switch for selectively connecting the storage capacitor to the input during an acquisition phase.

35 Claims, 16 Drawing Sheets

REFERENCE CIRCUIT SUITABLE FOR USE WITH AN ANALOG TO DIGITAL CONVERTER AND AN ANALOG TO DIGITAL CONVERTER INCLUDING SUCH A REFERENCE CIRCUIT

FIELD OF THE INVENTION

The present invention relates to a reference circuit suitable for use with a charge redistribution analog to digital converter, and to an analog to digital converter including such a reference circuit.

BACKGROUND

Analog to digital converters, such as successive approximation routine, SAR, converters often include a switched capacitor charge redistribution digital to analog converter having a plurality of weighted capacitors therein. As is known to the person skilled in the art, a successive approximation conversion can be performed by successively performing bit trials from a most significant bit to a least significant bit, and on the basis of comparing the output voltage from the switched capacitor digital to analog converter with a reference, deciding whether the currently trialled bit should be kept or reset, so as to eventually arrive at a bit pattern that best represents the analog input that is being converted by the analog to digital converter.

As part of this trial, "bottom plates" of the capacitors (as shown in FIG. 1) within the charge redistribution digital to analog converter within the SAR analog to digital converter are successively switched between a first voltage reference Vref1 and a second voltage reference Vref2. Typically Vref1 is held at a positive voltage by a reference circuit and Vref2 is a local ground, or Vref1 and Vref2 may be placed either side of a mid-point, such $$\frac{Vdd}{2}.$$

The voltage Vref1 is typically provided by an external voltage reference, such as a band gap reference, which drives a reference buffer. The output from the reference buffer is used to charge a reference capacitor which is generally large, having a value of 10 µF or so which has to be physically placed near the reference input pins of an integrated circuit incorporating the charge redistribution analog to digital converter.

The transfer of the reference voltage from the external capacitor to the on chip charge redistribution digital to analog converter, DAC, that is implemented within an analog to digital converter, ADC, occurs via tracks on a printed circuit board, package pins and often via bond wires connecting the package pins to the integrated circuit itself. Each of these components exhibits an inductance.

Operation of the charge redistribution ADC having a capacitor array DAC causes a varying capacitive load to be connected to the reference circuit. It is for this reason that the storage capacitor and reference voltage buffer are provided, which together provide the charge to maintain the reference voltage across the DAC at a fixed value. However use of the reference voltage buffer is expensive in terms of current consumption and itself can introduce a source of inaccuracy due to offset and noise.

SUMMARY OF THE INVENTION

According to a first aspect of the present invention there is provided a reference circuit for use with a charge redistribution analog to digital converter having a capacitor array, the reference circuit comprising:
an input for receiving a signal;
an output for supplying a reference voltage to at least one capacitor of the capacitor array;
a storage capacitor for storing the reference voltage;
a voltage modification circuit for comparing the reference voltage stored on the storage capacitor with the reference signal, and based on the comparison to supply a correction so as to reduce a difference between the reference voltage and the reference signal, the correction being applied during a correction phase; and
a first switch for selectively connecting the storage capacitor to the input during an acquisition phase.

It is thus possible to bring the storage of a reference voltage "on chip" and thereby bypass the inductance of the package pins and bond wires. Furthermore the circuit for applying the correction signal may now be operated under the control of an ADC controller such that the circuit may be partially or wholly depowered during some stages of the operation of the ADC.

According to a second aspect of the invention there is provided an integrated circuit comprising a digital to analog converter, and a reference circuit according to the first aspect of the invention.

According to a third aspect of the invention there is provided an integrated circuit comprising an analog to digital converter having a switched capacitor charge redistribution array, and a reference circuit according to the first aspect of the invention.

According to a fourth aspect of the present invention there is provided a method of providing a reference voltage to an analog to digital converter having a charge redistribution capacitor array, the method comprising: receiving at an input a reference signal voltage from a reference circuit; providing a reference voltage to at least one capacitor of the capacitor array; comparing the reference voltage with the reference signal voltage, and based on the comparison, supplying a correction signal to reduce the difference between the reference voltage and the reference signal voltage, the correction being supplied during a correction phase; and connecting a storage capacitor to the input during an acquisition phase so as to store the reference signal voltage thereon.

According to a fifth aspect there is provided an integrated circuit comprising a reference circuit in combination with a charge redistribution DAC having a plurality of capacitors within a switched capacitor array, the reference circuit comprising: an input for receiving an input voltage from a voltage source, an output for supplying a reference circuit output voltage to the DAC; a storage capacitor for storing a reference voltage; and a voltage modification circuit for causing an output voltage from the reference circuit stored on the storage capacitor to substantially equal the input voltage, said voltage modification circuit operating during a correction phase; and a switch for connecting the storage capacitor to the input during the acquisition phase.

BRIEF DESCRIPTION OF THE DRAWINGS

Embodiments of the present invention will now be described, by way of non-limiting example only, with reference to the accompanying Figures, in which.

DESCRIPTION OF EXAMPLE EMBODIMENTS

Figure 1:
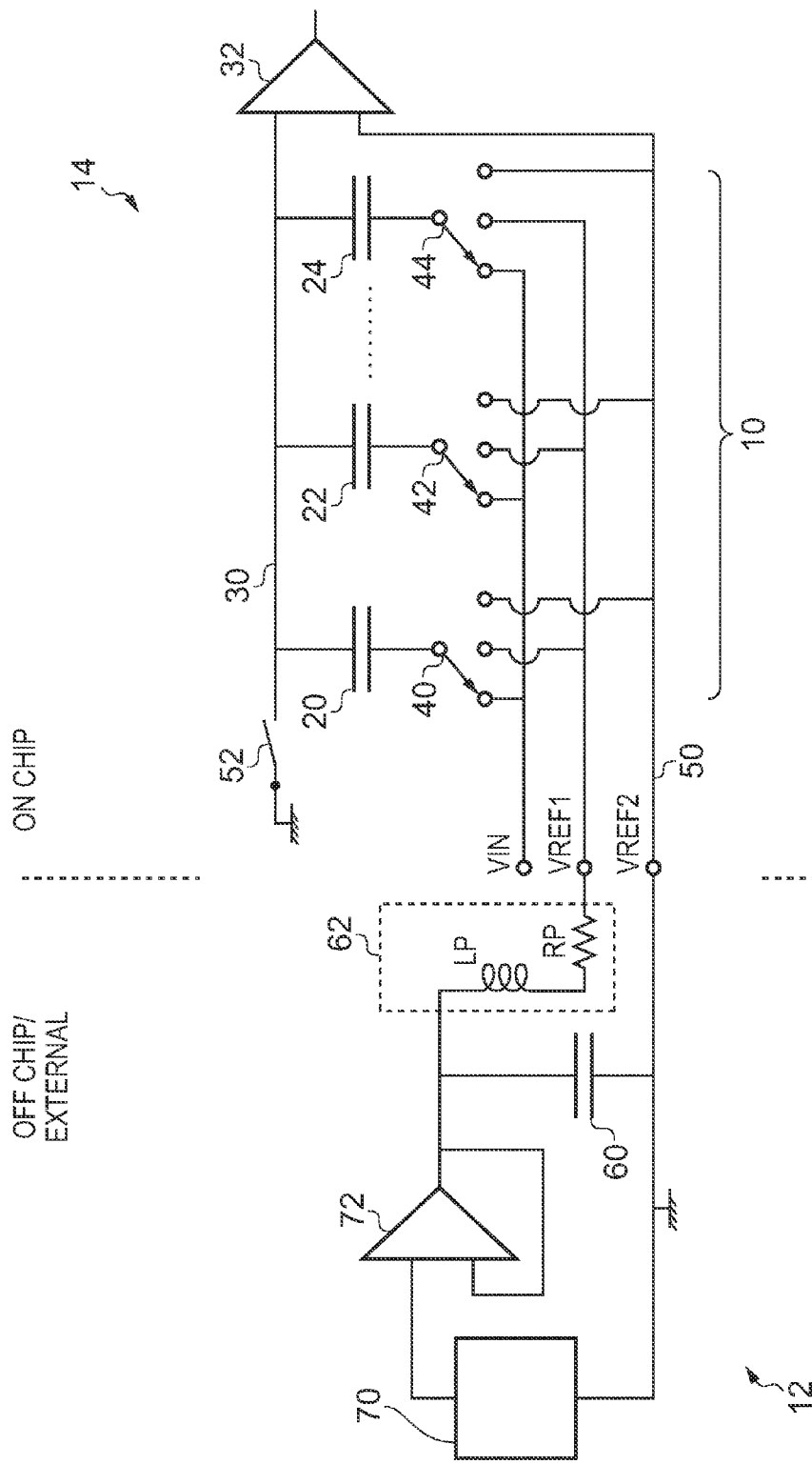
FIG. 1 is a circuit diagram of a SAR analog to digital converter including a charge redistribution digital to analog converter receiving reference voltages from an external reference circuit.

FIG. 1 schematically shows a prior art arrangement comprising a switched capacitor digital to analog converter, generally indicated 10 which is provided within an integrated circuit implementing an analog to digital converter 14 and which receives a first reference voltage Vref1 from an external reference circuit, generally designated 12. In this context "external" means that the reference circuit (or at least not all of it) is not provided on the same chip as the charge redistribution digital to analog converter 10. Thus, a relatively large storage capacitor 60 will be external to the integrated circuit, even though other parts of the circuit such as a buffer might be provided on the integrated circuit. The DAC also receives Vref2, which may be a local 0V, ground or Vss to which all other voltages are referenced.

Although charge redistribution digital to analog converters as part of successive approximation analog to digital converters are well known, for completeness a brief description of their operation will be presented here. The charge redistribution digital to analog converter comprises a plurality of capacitors, of which in this example three capacitors 20, 22 and 24 are shown. Other capacitors may exist between capacitors 22 and 24. In a converter that does not have redundancy, the capacitors are binary weighted. Thus, if only three capacitors existed and capacitor 24 had a notional value of "1 C" then the capacitor 22 would have a value of "2 C" and a capacitor 20 would have a value of "4 C". Each capacitor can be regarded as representing a bit in a binary word, and hence the largest capacitor, in this example 20, represents the most significant bit, MSB, having a weight of 4, whereas the smallest capacitor 24 represents the least significant bit, LSB, having a weight of 1. Such capacitor arrays as used in analog to digital converters commonly provide between 12 and 16 bits of resolution and this implies a corresponding number of capacitors. It is also known that to avoid scaling problems between the MSB and the LSB, the capacitor array can be segmented one or more times. This effectively allows a rescaling between capacitors in each segment of the array and avoids the need for the largest capacitor of the DAC to be, for example $2^{16}$ times the size of the smallest capacitor for a 16 bit converter. Although not shown, the switched capacitor array or a segment thereof is typically terminated by an additional terminating capacitor having a value equal to the least significant capacitor within that array.

It is also known to vary the 'weights' (that is the relative capacitance of the capacitors) or numbers of capacitors within the array in order to provide some redundancy, i.e. the ability to recover from an incorrect bit decision during the conversion process. This can, for example, be achieved by occasionally inserting at an additional bit within the array. A further approach to providing redundancy is to change the "radix" of the capacitors in the array from 2 (which represents binary weighting) to a smaller number such as 1.8. Thus the ratio of one capacitor to its neighbour becomes 1.8 rather than 2. This inserts redundancy into the array such that an incorrect bit decision can be corrected as the conversion process proceeds. In either case, redundancy is implemented so as to allow errors of either sign (i.e. the error has made the result underweight or overweight) to be corrected as the conversion proceeds, as is known to the person skilled in the art.

As shown in FIG. 1 each of the capacitors has a first plate, which will also be referred to as a top plate which is connected to a conductor 30 which itself is connected to a first input of a comparator 32. Each capacitor also has a second or bottom plate which is connected to an electronic switch. The first capacitor 20 is connected to a first switch 40, the second capacitor 22 is connected to a second switch 42 and the third capacitor 24 is connected to a third switch 44. The switches are schematically shown as three position switches although in reality they may be implemented as three field effect transistors per switch which are controlled by a switch controller (now shown) to implement a three position break before make switch function. The switch 40 can be regarded as being operable in a first position or mode to connect the bottom plate of the capacitor 20 to a signal input Vin. In a second position or mode it is operable to connect the bottom plate of the capacitor 20 to Vref1, and in a third position or mode it connects the bottom plate of the capacitor 20 to a second input Vref2, which often corresponds to a local ground or a "negative" power rail. The second and third switches 42 and 44 are similarly configured, and the second input of the comparator is also connected to the local ground via a conductor 50.

In a sample or track phase of operation of the analog to digital converter described in this example, the switches 40, 42 and 44 are connected to Vin whilst a further switch 52 is closed so as to connect the conductor 30, and hence the top plates, to ground. This enables the capacitors 40, 42 and 44 to become charged with the voltage Vin. The analog to digital converter then moves to a convert phase in which switch 52 is opened so as to allow the voltage on the conductor 30 to float, and the switches 40, 42 and 44 are initially connected to Vref2. The bit trial sequence can then begin. Initially the first bit, i.e. the most significant bit is trialled by connecting the bottom plate of the capacitor 20 to Vref1. This causes charge redistribution between the capacitors to occur as they form a potential divider. As a result the voltage at a first input to the comparator changes and after a settling time has elapsed, the comparator is strobed (i.e. its output is examined) in order to determine whether the voltage at the first input is greater or less than the voltage at the second input. If the voltage of Vin was sufficiently great such that it exceeds the value equivalent to $$\frac{Vref1}{2},$$

then the most significant bit is kept and capacitor 40 remains connected to Vref1, otherwise the bit is discarded and switch 40 is operated to connect the bottom plate of the MSB capacitor 20 back to Vref2. The next bit trial proceeds to the second bit where the lower plate of capacitor 22 is connected to Vref1 (the state of switch 40 remaining unchanged from whichever position it was left in after the end of the first bit trial) after a settling time the output of the comparator 32 is examined to see whether the switch 42 should be left as it is, or reset back to connecting the lower plate of the capacitor 22 to Vref2. Switch 42 is then either reset or left alone as a result of that comparison, and the trial moves on to the next capacitor 24 and switch 44 is changed from Vref2 to Vref1. Again after a settling time the output of the comparator is examined to see whether switch 44 should be left in its current position or reset. At the end of the trial sequence the positions of the switches 40, 42 and 44 can be examined and these represent the converted result. The sequence can obviously be extended to include more than three capacitors. Similarly the sequence can be extended to include switched capacitor arrays having redundancy, whether this is by the inclusion of additional redundant capacitors or by using a radix less than 2, but then the switch sequence needs to be examined and further converted into a binary word. However once again this process is known to the person skilled in the art and need not be described further. Although the ADC has been described as a single ended device, the above description can be extended to differential converters.

It is evident that switching any of the switches 40, 42 and 44 results in circulating current flows. Thus, if switch 40 is switched from Vref2 to Vref1 such that the bottom plate of capacitor 20 becomes increased in voltage, then a transient circulating current flow exists from capacitor 20 through capacitors 22 and 24 and their associated switches to Vref2. The current then flows through a storage capacitor 60 of the voltage reference 12 and back through the terminal Vref1 and switch 40 to the bottom plate of the first capacitor 20.

This current flow occurs along the bond wires of the integrated circuit between its external pins and the nodes Vref1 and Vref2 and also along conductor tracks within a printed circuit board. The tracks and the bond wires each exhibit a parasitic inductance and a parasitic resistance. These unwanted impedances are designated by inductor LP and resistor RP enclosed within a chain line 62 in FIG. 1. Furthermore, the storage capacitor 60 will also exhibit an inductance and resistance, and these parasitic components can also be represented within the values of LP and RP. Similarly the switches 40, 42 and 44 also exhibit a resistance which again can be represented within the value of RP.

The reference circuit comprises a reference voltage generator 70, which is a precision voltage reference of any suitable implementing technology, which provides an output to a buffer 72. The buffer 72 protects the voltage reference 70 from having to supply current to the switched capacitor digital to analog converter 10 within the analog to digital converter. By its very nature, the buffer 72 consumes power even when the analog to digital converter is inactive, for example because the ADC it has completed one conversion and is waiting until another one is scheduled.

At each operation of the switches 40, 42 and 44 the circulating current flows through the various capacitors and the parasitic inductor and resistor. The combination of the capacitors and inductors has the potential to form an LC circuit which may ring. In order to avoid this the circuit should be at least critically damped, in which case the resistance Rcritical of RP must be equal to $(4 L/C)^{1/2}$. The time constant Tcritical, for a circuit at critical damping is obtained by multiplying Rcritical by the capacitance of the circuit C and has a value of $(4 LC)^{1/2}$. The settling time of the switched capacitor array, as determined by Tcritical, is then limited by parasitic inductance Lp.

Embodiments of the present invention allow a faster settling switched capacitor array by bringing a copy of the reference voltage "on-chip" and avoiding any circulating current through LP. Thus the reference voltage is brought within the same integrated circuit as the switched capacitor charge redistribution digital to analog converter within the ADC.

Figure 2:
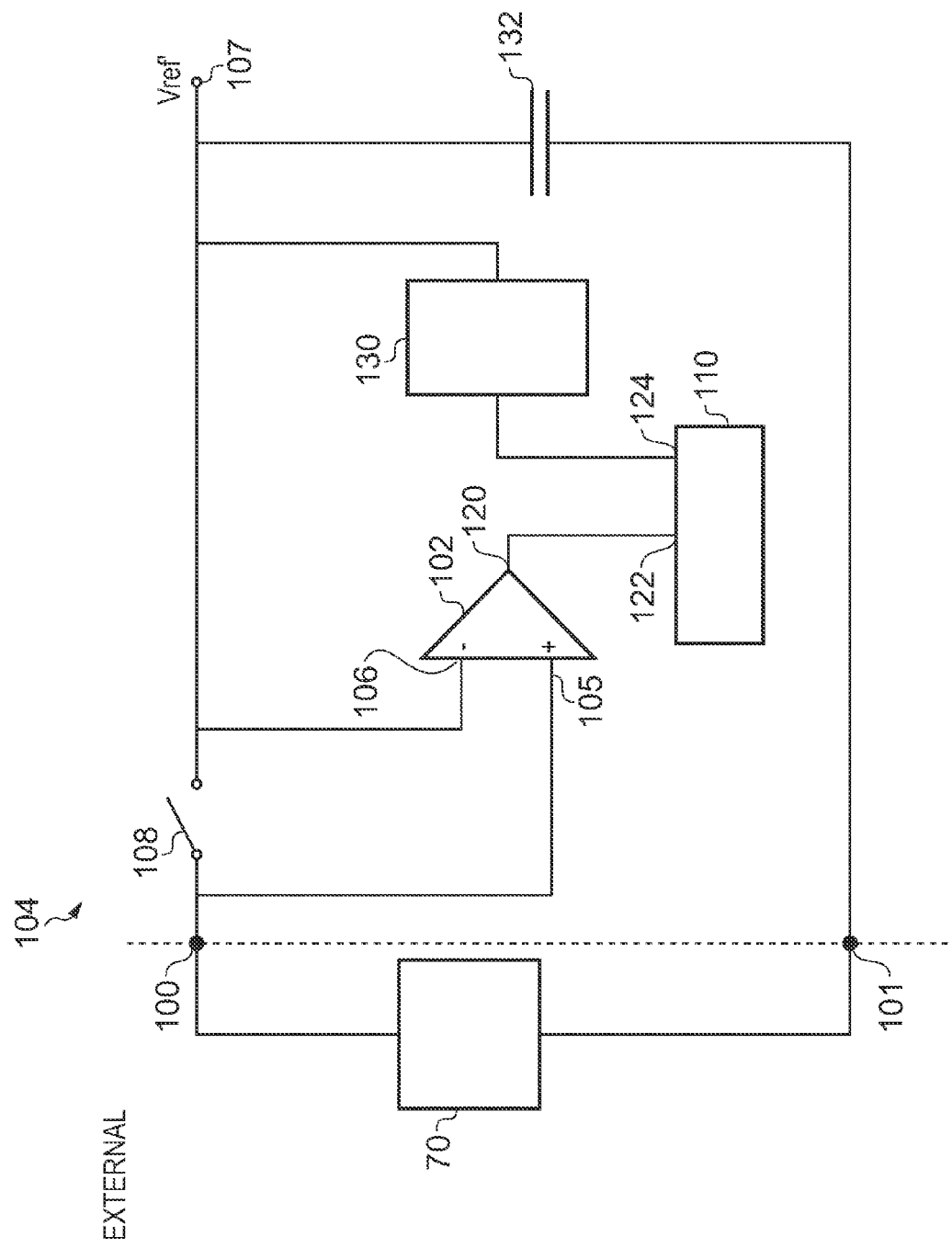
FIG. 2 is a schematic diagram of a reference circuit constituting a first embodiment of the present invention.

FIG. 2 is a circuit diagram schematically illustrating a reference circuit constituting a first embodiment of the invention. Within FIG. 2, the external high precision voltage reference 70 of FIG. 1 is still provided and is still "off-chip", although it could be on-chip. The reference 70 is connected to first and second terminals 100 and 101 of a reference circuit, generally designated 104 which is provided within the same integrated circuit as the charge redistribution digital to analog converter 10. The voltage output from the reference circuit 70 can be regarded as being a "reference signal", and is provided, either directly or via a level shifting arrangement, to a first input 105 of a comparator/amplifier 102. In this example only a comparator action is required, and consequently for the rest of the description with respect to FIG. 2 it will be described as being a comparator 102. A second input 106 of the comparator 102 is connected to an output node 107 which provides an internal copy of the reference voltage, designated Vref, to the DAC 10 of the ADC. A first switch 108 operable under the command of switch control logic 110 can be opened or closed by a signal by the switch control logic 110 as will be described later on. Switch 108 is implemented by a transistor. When switch 108 is open, as shown in FIG. 2, the comparator receives the voltage from the node 107 at its second input and acts to form a comparison between the reference signal Vref_external provided from the external voltage reference circuit 70 and Vref being output by the voltage reference circuit 104. The result of this comparison is output at an output 120 of the comparator 102 to a comparator input 122 of the switch control circuit 110. A first output 124 of the switch control circuit 110 is provided to a voltage modification circuit 130 which is arranged to exchange charge with, for example to cause charge to flow towards, an internal storage capacitor 132 of the reference circuit 104. The act of transferring charge onto the internal storage capacitor 132 increases the voltage Vref' at node 107 until such time as it just exceeds, or with the addition of an intentional offset is a little less than, the external voltage reference Vref_external, thereby causing the comparator 102 to modify its output to the switch control logic 110, which in turn switches the voltage modification circuit 130 off. FIG. 2 shows the voltage modification circuit 130 being connected to a first, uppermost, plate of capacitor 132 which is connected to the output node 107. However the output voltage modification circuit 130 can also be connected to the second or lowermost plate of the capacitor 132 as well as to the first plate thereof, as shown in FIG. 3.

Figure 3:
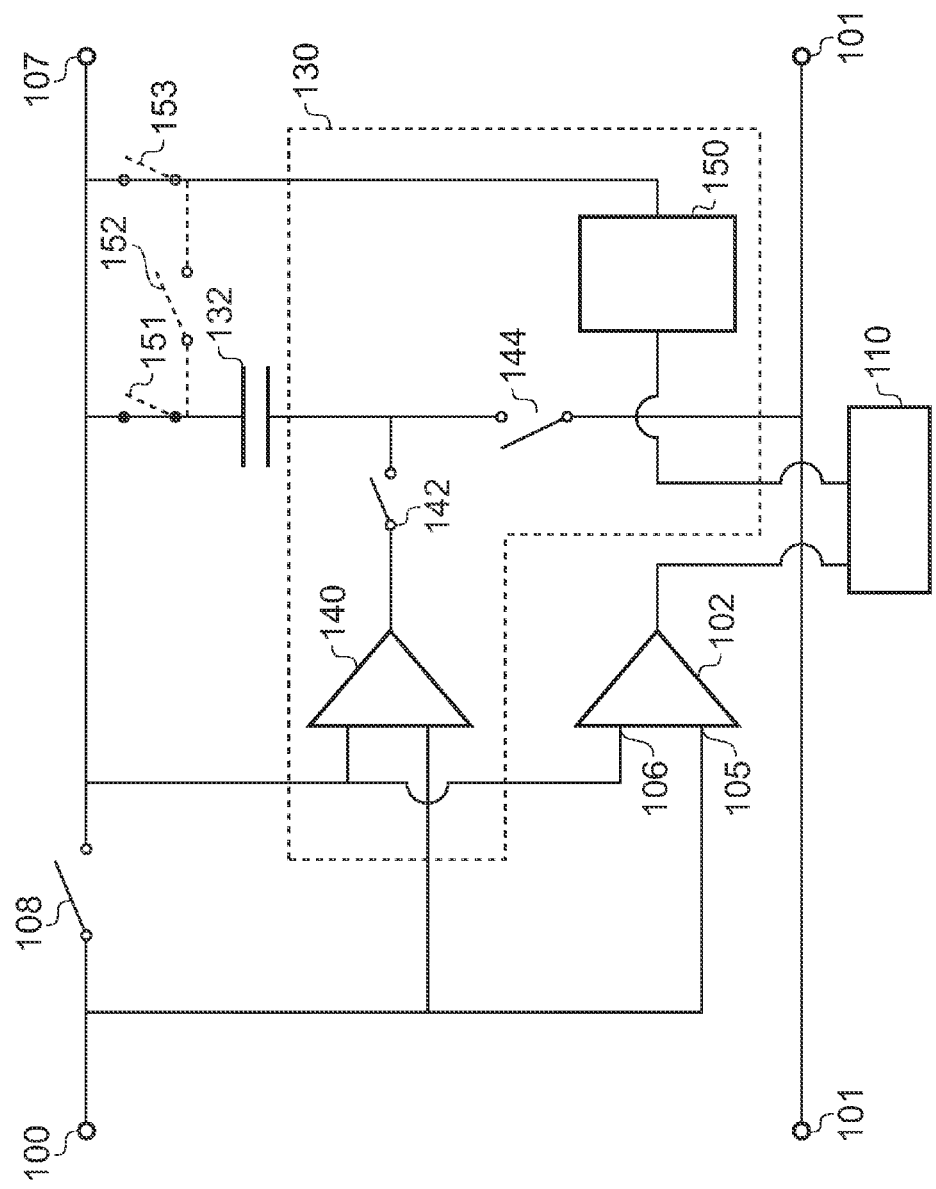
FIG. 3 is a circuit diagram of a reference circuit constituting a further embodiment of the present invention.

In FIG. 3 like parts have been designated with like reference numerals. The voltage modification circuit 130 has been expanded and includes an amplifier 140 which can be selectively connected to a bottom plate of the internal capacitor 132 via an electronically controlled switch 142. A further switch 144 is provided between the bottom plate of the capacitor 132 and node 101, which connects to Vref2. Other implementations are possible, and the bottom plate of the capacitor 132 may also be connected to either supply rail, ground (if different from the low voltage supply) or to a further node held at a stable voltage and having a low impedance. The switches 142 and 144 are driven such that when switch 144 is closed switch 142 is open. The voltage modification circuit 130 also includes means for delivering charge to recharge the capacitor 132. In integrated circuits where the supply voltage Vdd may be less than Vref1 a charge pump 150 under the control of the control circuit 110 is provided to perform this function. A charge pump may still be used if Vdd is greater than Vref1. Where Vdd is greater than Vref1 other current flow delivery circuits may be used (such as voltage followers or current sources, which are merely mentioned as non-limiting examples) to charge the capacitor to a desired potential.

In a modification to the circuit of FIG. 3, an additional switch 151 shown in dotted outline may be provided between the top plate of the capacitor 132 and the output node 107 so as to allow the capacitor to be disconnected from the output node. The charge pump 150 (or equivalent current flow or voltage control circuit operable to charge the capacitor 132 to a desired voltage, e.g. Vref_external) may also be connectable to the internal capacitor 132, for example via switch 152 and may be disconnected from the output node by switch 153. Thus, in this arrangement the capacitor 132 may be disconnected from the output node 107 and charged to a desired voltage while it is disconnected. Switch 108 may be closed during this time or further switches may be provided to connect the amplifier to node 107.

Actual implementations of the circuit schematically illustrated in FIG. 3, together with a description of its operation, will now be described.

Figure 4:
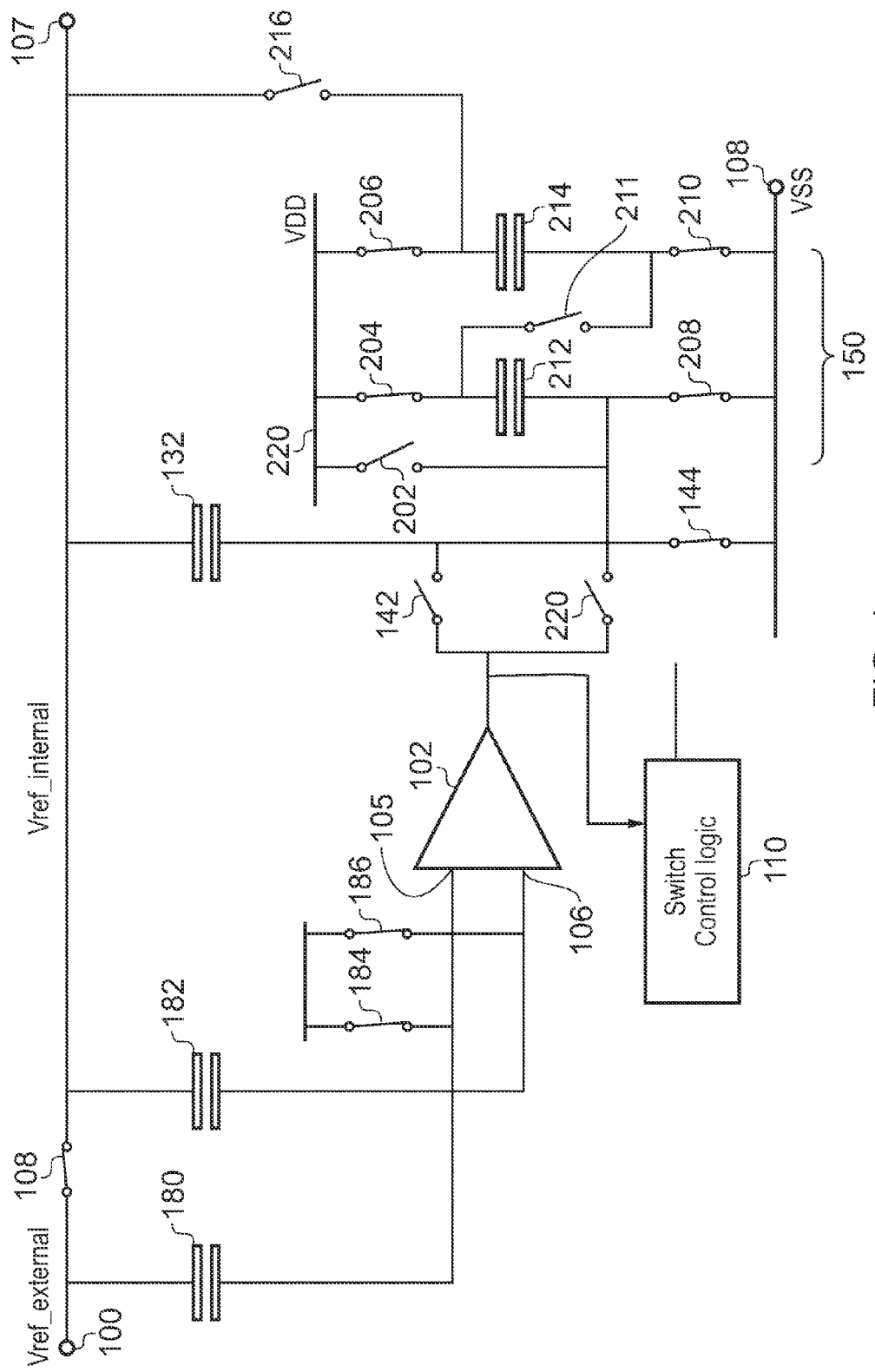
FIG. 4 is a circuit diagram of an embodiment of the present invention during an acquisition phase of operation.

FIG. 4 shows the arrangement of FIG. 3 in greater detail, and during a first phase of operation in which it is in an acquisition phase, when the external reference voltage Vref_external is being sampled onto the internal storage capacitor 132. Amplifier/comparator 102 functions both as an amplifier and a comparator, although if desired this function could be performed by dedicated amplifier and comparator blocks. During the acquisition phase the amplifier/comparator 102 can be depowered to conserve energy.

A first input 105 of the amplifier/comparator 102 is connected to the input node 100 via a first level shifting capacitor 180. The second input 106 of the amplifier/comparator 102 is connected to the output node 107 via a second level shifting capacitor 182. In order that these capacitors can have a known voltage established across them, shorting switches 184 and 186 are provided to connect the first and second inputs 105 and 106 to a common voltage such as VDD. The use of level shifting capacitors is particularly useful when Vref_external is greater than supply rail VDD to the integrated circuit or where it is desired to modify the voltage presented at the input to the amplifier/comparator 102 so as to place that voltage in an optimum operating input window. In the prior art the external reference voltage may be 5V. As a result the buffer 72 must operate from at least a 5V supply. In the embodiment shown in FIG. 4, amplifier/comparator 102 does not have to output the reference voltage, and can be operated from a lower supply rail, for example 1.8V, thereby consuming less energy than if it took the same current from a 5 volt supply. During the time that switches 184 and 186 are closed, it follows that the input voltages of the first and second inputs are the same as each other, and hence the amplifier/comparator 102 can be instructed to execute an auto-zero operation. Additionally or alternatively an auto-zero circuit can be implemented within the amplifier/comparator 102 so as to enable it to perform an auto-zero operation when it is not actively controlling the output of the reference circuit.

FIG. 4 also shows one possible implementation of the charge pump 150. Other implementations are possible. The charge pump comprises first to sixth charge pump switches 202, 204, 206, 208, 210, 211, first and second charge pump capacitors 212, and 214, and a charge pump output switch 216. Each of the first and second charge pump capacitors 212 and 214 has first and second plates. With the plates orientated as shown in FIG. 4 it is convenient to regard the first plate as being the uppermost plate and the second plate as being the lowermost plate. Thus the first charge pump switch 202 is placed between a conductor 220, which conveniently may be an internal supply voltage VDD and a second plate of the first capacitor 212. The second charge pump switch 204 extends between the first plate of the first charge pump capacitor 212 and the conductor 220. The third charge pump switch 206 extends between a first plate of the second charge pump capacitor 214 and the conductor 220. The fourth charge pump switch 208 extends between the second plate of the first charge pump capacitor 212 and a local supply rail VSS. The fifth charge pump switch 210 extends between the second charge pump capacitor 214 and VSS. The first plate of the first charge pump capacitor 212 can be connected the second plate of the second charge pump capacitor 214 via the sixth charge pump switch 211. Finally the first plate of the second charge pump capacitor 214 can be connected to the top plate of the storage capacitor 132 via the charge pump output switch 216.

An amplifier to charge pump interconnect switch 220 is provided to selectively connect the output of the amplifier 102 to the second plate of the first charge pump capacitor 212.

All of the switches are under the control of the switch control logic 110.

Figure 5:
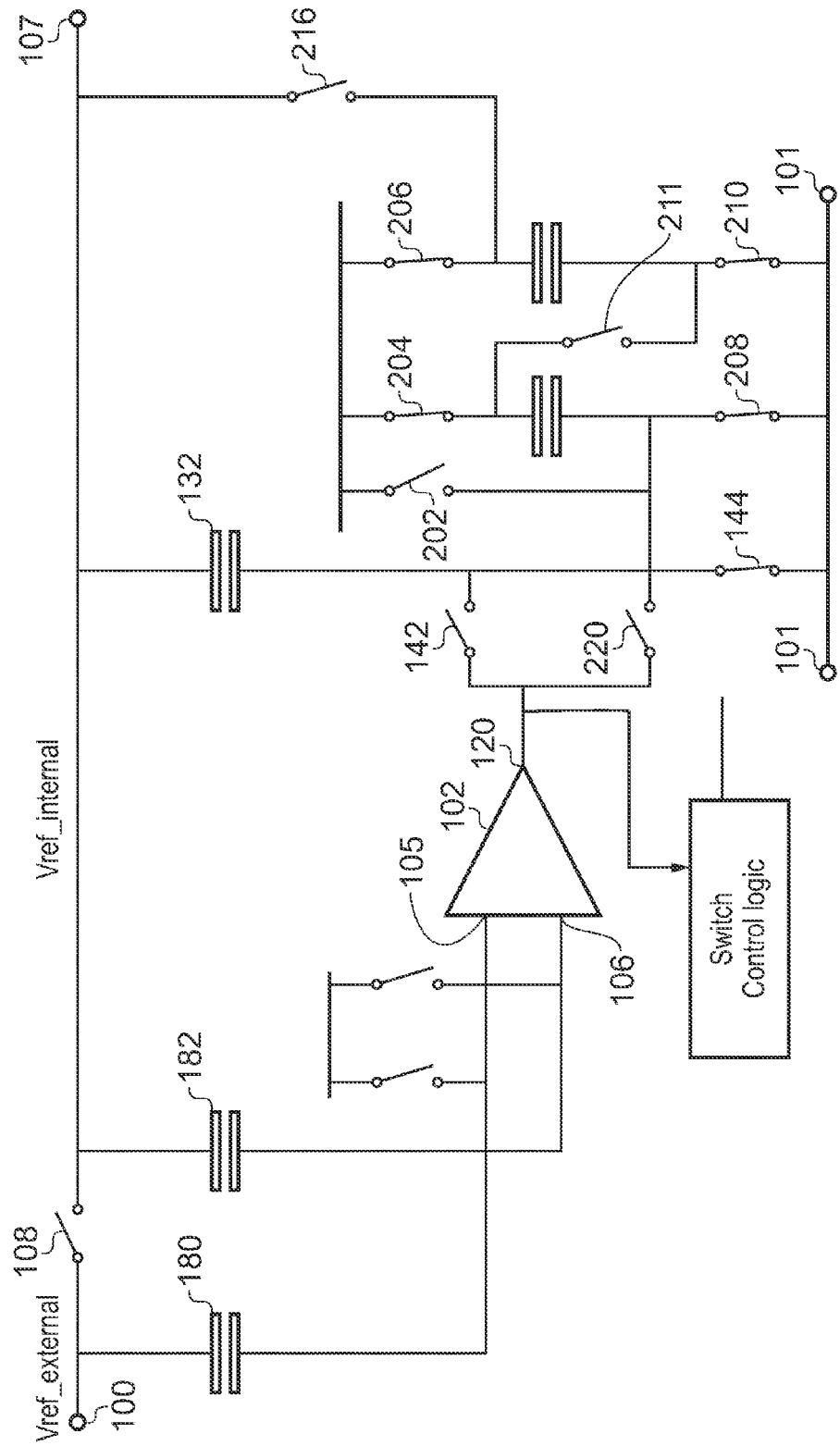
FIG. 5 shows a circuit arrangement of FIG. 4 during a first conversion phase of operation.

During the first phase of an operating cycle the circuit is in an acquisition phase, as illustrated in FIG. 4, the first switch 108 is closed so that Vref_external is provided to the uppermost (as shown in FIG. 4) plates of the capacitors 180, 182. The shorting switches 184 and 186 are closed so that the bottom plates of the capacitors 180 and 182 are both connected to the same voltage, for example VDD. Thus both capacitors 180 and 182 will have the same voltage difference across their plates. During the acquisition phase the switch 142 is open such that the internal storage capacitor 132 is effectively disconnected from the amplifier and the charge pump output switch 216 is also open. Switch 144 is closed. During this acquisition phase the voltage reference 70 is connected to the top plate of the internal storage capacitor 132 through the first switch 108 so as to charge it up to Vref_external. It can be expected that at power up the reference circuit and the voltage reference can stay in the acquisition phase for sufficiently long for this charging to occur, and that the DAC 10 of the ADC does not present a changing load. The circuit can now move into a first conversion phase, as shown in FIG. 5 in which it can provide a reference voltage to the output node 107, but where the reference voltage is not actively managed. Thus, as shown in FIG. 5, switch 108 has been opened so as to disconnect the external voltage reference 70 from the rest of the circuit. The shorting switches 184 and 186 have also been opened so that the capacitors 180 and 182 now merely serve as level shifting devices such that the amplifier/comparator 102 can compare a level shifted version of the output voltage at node 107 with a similarly level shifted version of the external voltage reference from node 100.

The charge redistribution digital to analog converter within the analog to digital converter may now be operated to perform a first A bit trials of an M bit conversion process in order to convert the most significant bits thereof. As the bit trials progress charge may be drawn from the internal storage capacitor 132 and the voltage Vref at the node 107 may start to drift away from that of Vref_external.

The first few bit trials may be performed by an additional analog to digital converter such as a mini SAR or Flash ADC which may use capacitors that are substantially smaller than the capacitors of the main ADC as to reduce the loading on Vref_internal and therefore the drift of this node's voltage from Vref_external during this first conversion phase. The use of a mini SAR ADC is disclosed in U.S. Pat. No. 5,621,409, and use of a Flash ADC is disclosed in U.S. Pat. No. 6,828,927. The values determined by the additional ADC are then used to set the corresponding capacitors states within the main DAC of the main ADC with the remaining bits being determined within the main ADC. The drift is not significant if the main converter exhibits sufficient redundancy to correct for an incorrect bit decision made by the additional ADC.

Figure 6:
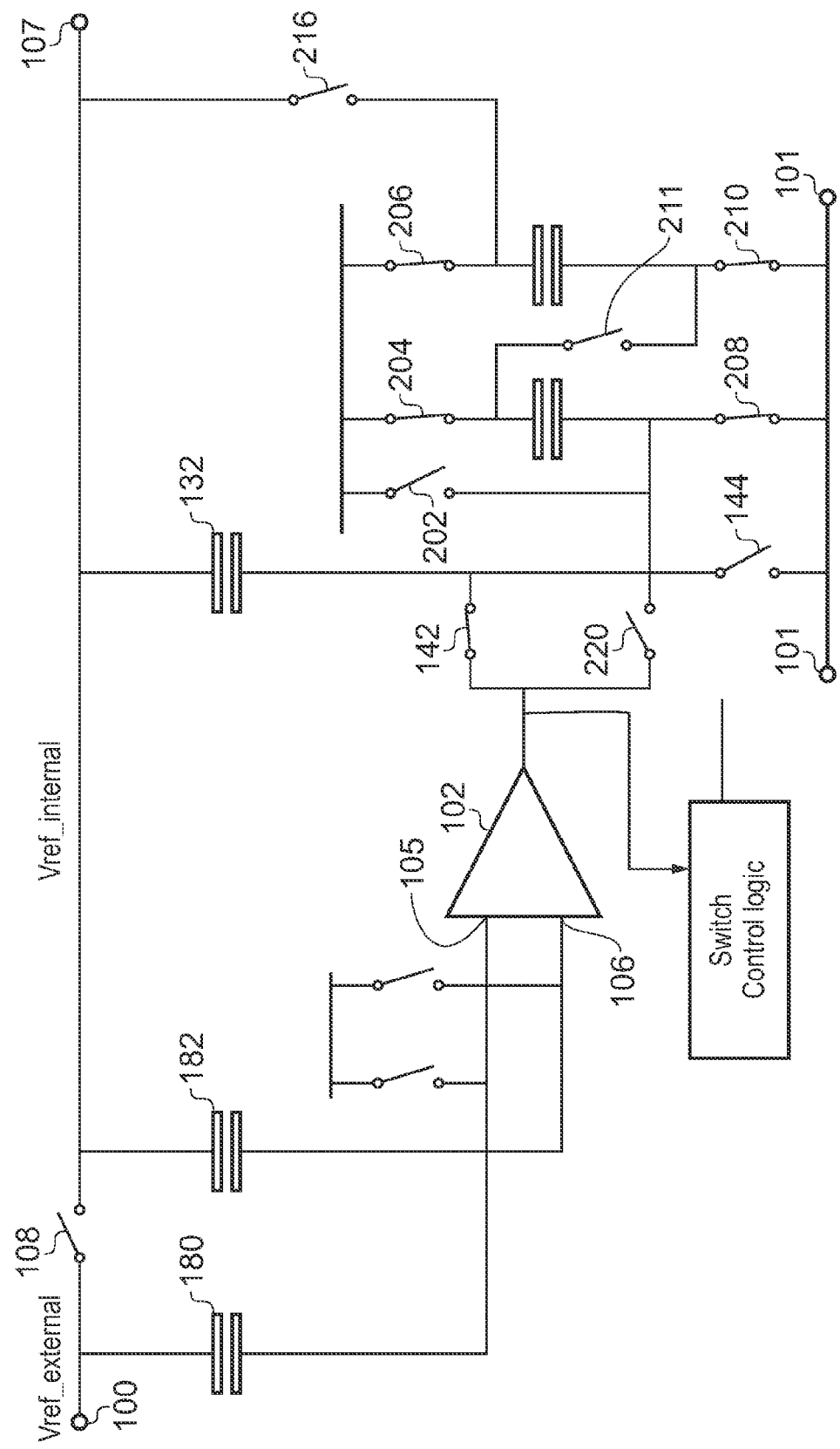
FIG. 6 shows the circuit of FIG. 4 during a second conversion phase of operation.

After the first A trials have been completed, the reference circuit may move into a second conversion phase, shown in FIG. 6, in which the amplifier/comparator 102 is energised and configured to act as an operational amplifier. Alternatively, the first conversion phase may be skipped and the circuit may transition directly from the acquisition phase to the second conversion phase of operation. Switch 144 is opened and switch 142 is closed so as to connect the bottom plate of the storage capacitor 132 to the output of the amplifier 102. This creates a negative feedback loop including the amplifier 102, and in response it varies its output 120 so as to minimise the voltage difference between its inputs 105 and 106. As a result, the voltage Vref at node 107 is returned to match that of Vref_external.

The bit trails can now be continued for the next B trials with the amplifier action serving to hold the node 107 at the correct reference voltage. The sum of A and B may be less than M.

As the bit trials progress, charge may become depleted from the internal storage capacitor 132 and the voltage across it may vary. However the action of the amplifier acting through the capacitor 132 serves to hold the node 107 at the correct voltage. It should be noted that since the capacitor 132 is driven by the output of amplifier 102, and merely acts as a voltage translation device, the amplifier is not loaded by the capacitance of the capacitor 132, which may be several 10 s of pF, but instead drives the series sum of capacitor 132 and the capacitance of the charge redistribution digital to analog converter within the ADC, which is typically of the order of only a few pF. The resulting load on amplifier 102 is then to first approximation just that of the charge redistribution digital to analog converter within the ADC. If the relative voltages of the supply and Vref_external allow, then switch 142 could be instead between the amplifier output and the first terminal of capacitor 132. In which case the amplifier would be driving capacitor 132 and the charge redistribution digital to analog converter in parallel. Switch 144 may be open to reduce the loading on amplifier 102.

As the bit trails have been progressing for some time, the successive approximation routine will now only be trialling the least significant bits, and the value of these capacitors is proportionally much smaller than those of the more significant bits, and consequently the load that they present to the voltage reference is much reduced. This means that the reference circuit can now optionally operate in a third conversion phase or mode of operation as will be discussed with respect to FIG. 7.

Figure 7:
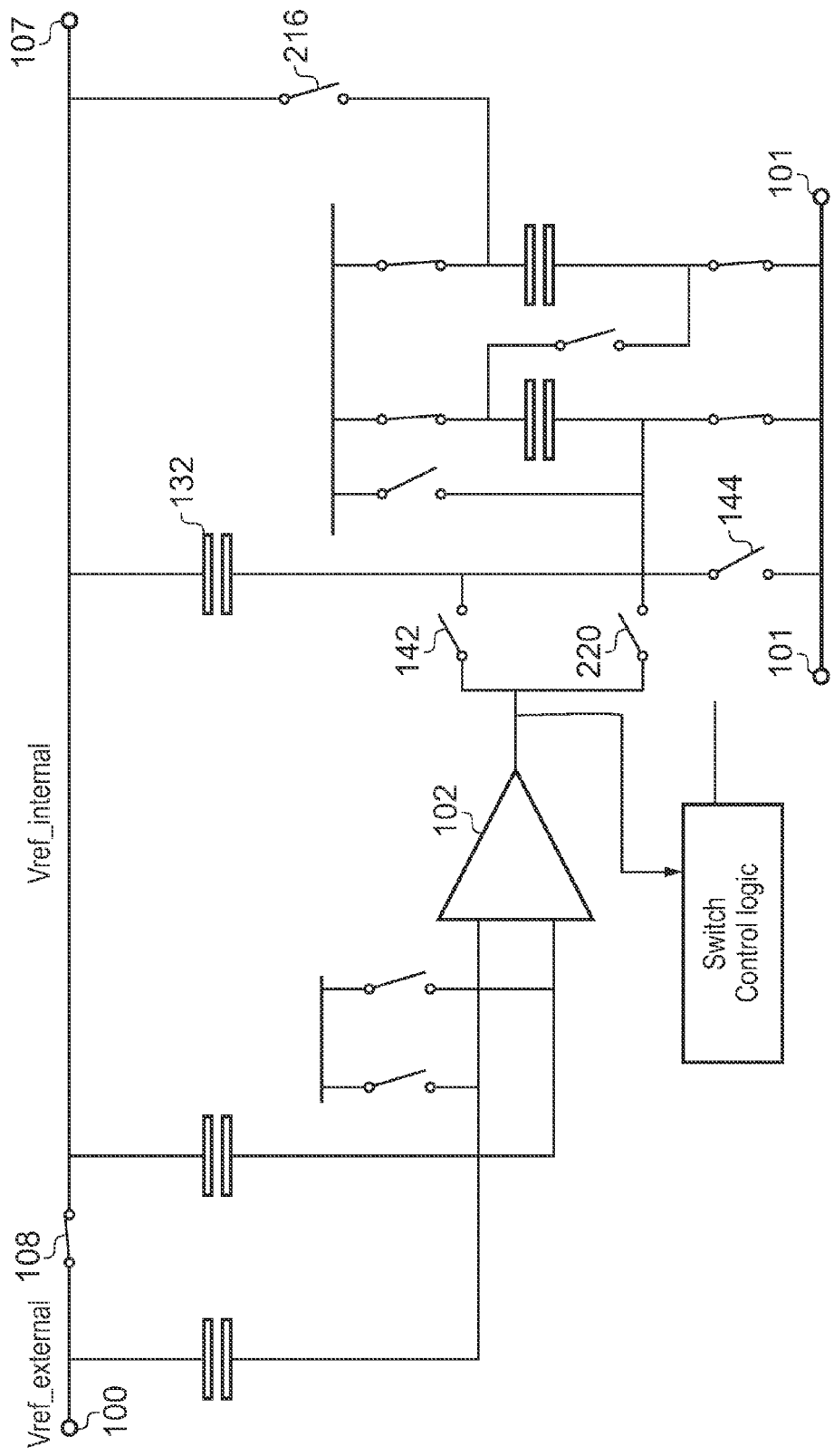
FIG. 7 shows the circuit of FIG. 4 during a third conversion phase of operation.

In this third conversion phase, as shown in FIG. 7, switch 142 is opened so as to disconnect the amplifier from the second plate of the internal storage capacitor 132. Switch 144 remains open such that the capacitor 132 is now effectively disconnected. Switch 108 is closed such that the external reference 70 now provides its output voltage directly to node 107. This can be done because the capacitors being trialled in that bit trials A+B≥Trial number≥M are now comparatively small and hence very little charge is taken. The conversion sequence can then be completed whilst operating in this mode. However, as will be disclosed later with respect to FIG. 12, multiple internal storage capacitors may be provided, and hence it may not be necessary to operate the circuit in the third conversion phase as these individual storage capacitors may hold a representation of Vref_external. If capacitor 132 is disconnected from node 107 using a circuit topology like that shown in FIG. 3 or, as will be described later with respect to FIG. 14, where switch 151 is provided, then optionally recharging of the storage capacitor in the correction phase could commence, and overlap with the third conversion phase.

The analog to digital converter operates in a cyclical manner and typically on a fixed schedule. Thus having completed one conversion, it must be prepared for a further conversion. However during the conversion sequence the charge on the internal capacitor 132 may have become depleted. While it would be possible to simply charge capacitor 132 by closing switches 108 and 144 this would draw substantial charge from Vref_external. It is therefore beneficial to restore the charge on capacitor 132 before closing these switches. An initial phase of the charge restoration process which corresponds to the correction phase will now be described with reference to FIG. 8.

Figure 8:
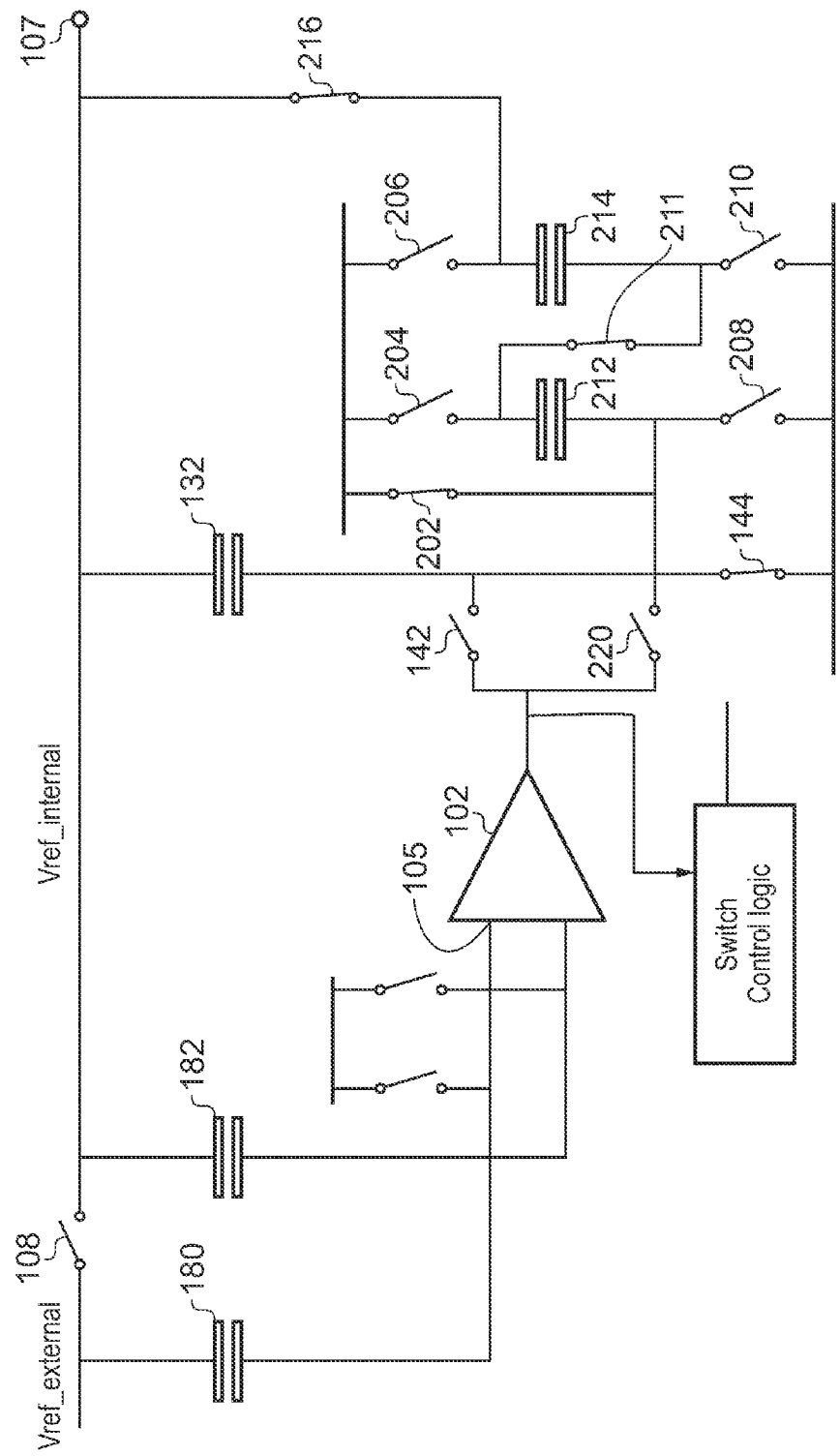
FIG. 8 shows the circuit of FIG. 4 during a correction phase in which a charge pump is used to restore a voltage across a reference capacitor.

As shown in FIG. 8 switch 108 is opened so as to isolate the voltage reference 70 from the reference circuit, except for the fact that its signal is still provided to a first input of the amplifier/comparator 102 via capacitor 180. The switch 144 is closed, thereby reconnecting the capacitor 132 back into the circuit such that the second input of the amplifier sees the voltage across storage capacitor 132.

Figure 9:
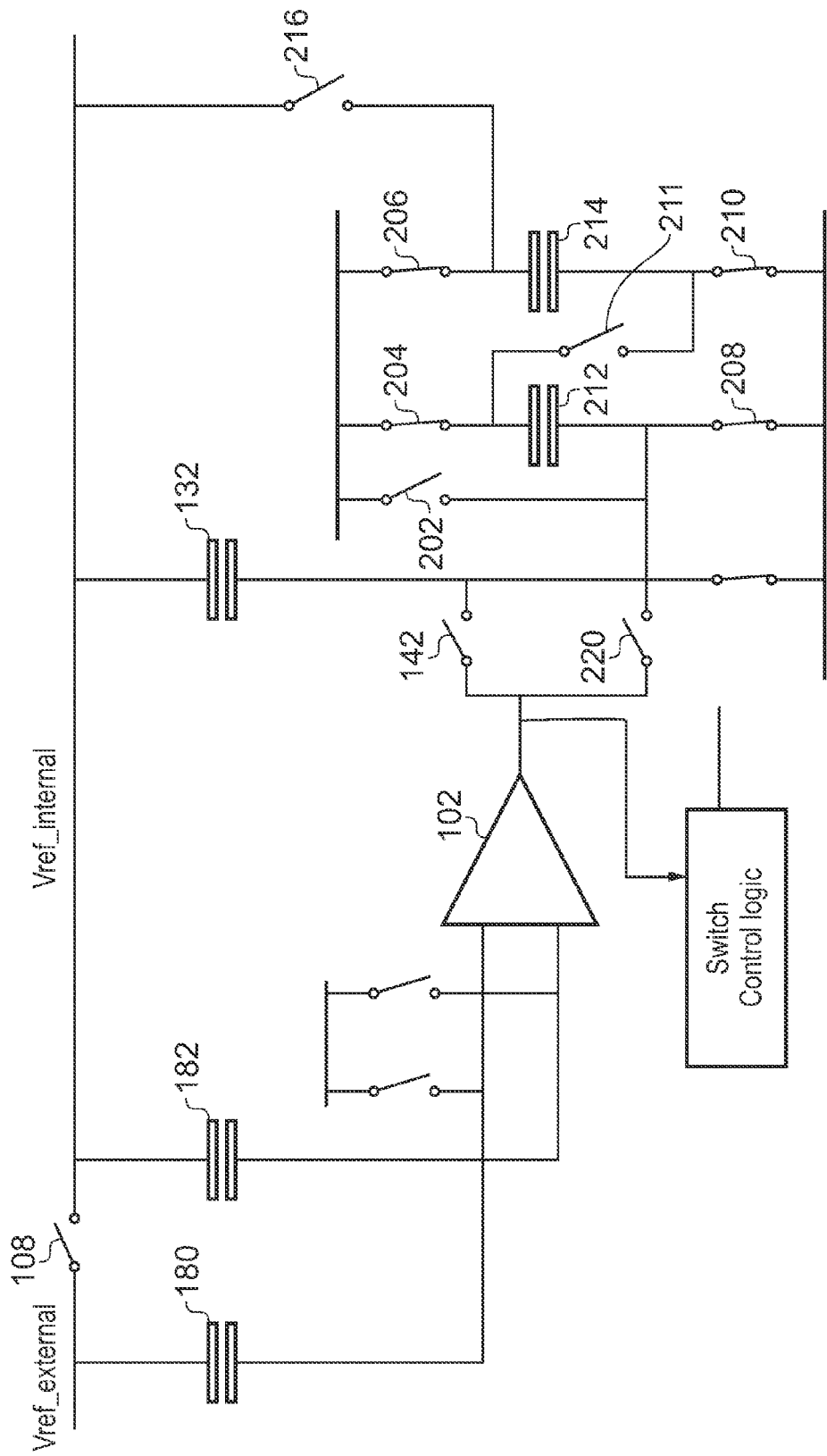
FIG. 9 shows a second phase of the charge pump operation.
Figure 10:
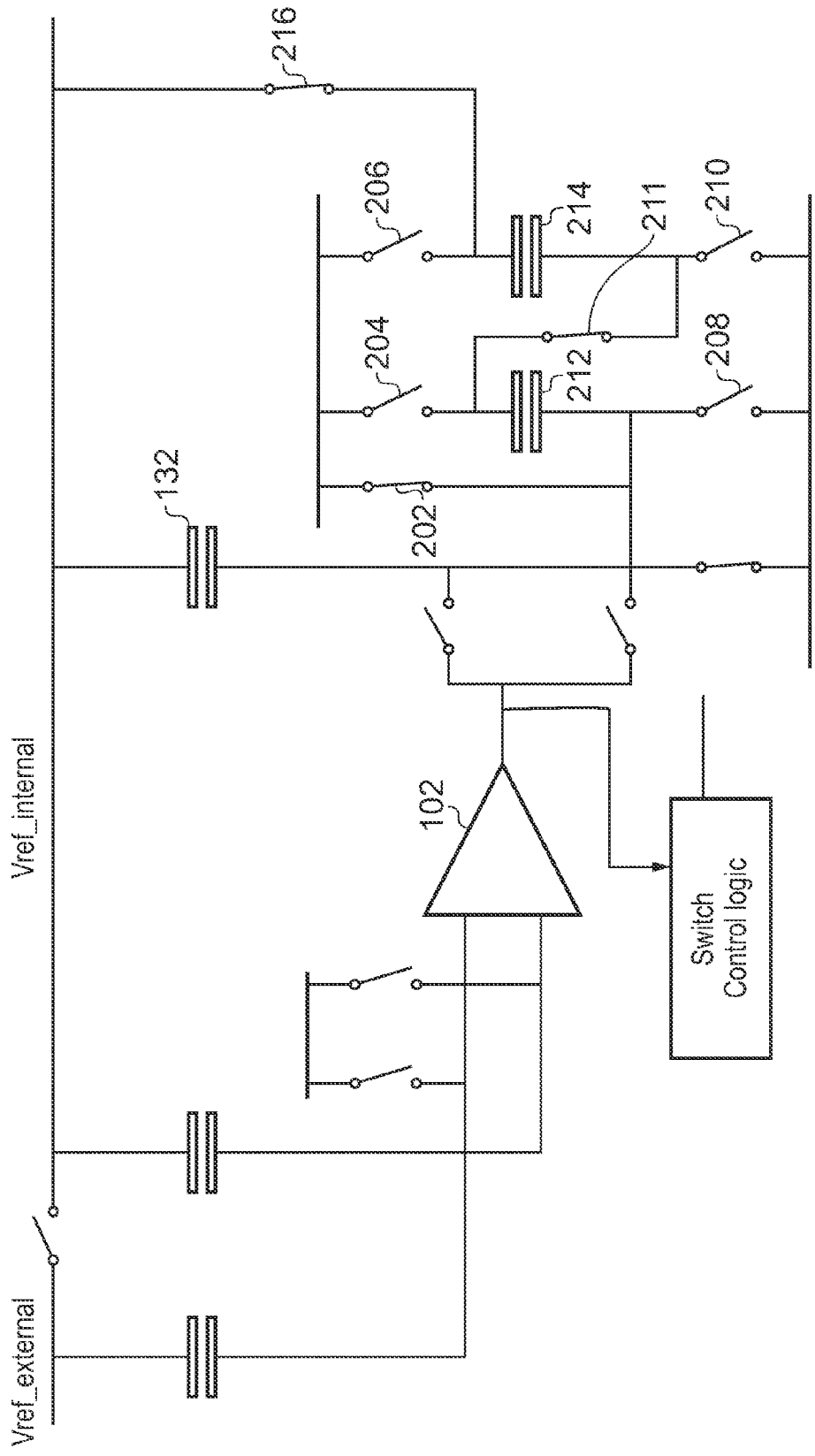
FIG. 10 shows a further stage of charge pumping.

In the preceding modes of operation the switches 204, 206, 208 and 210 had been closed such that the capacitors 212 and 214 had been charged to VDD. As shown in FIG. 8 these switches 204, 206, 208 and 210 are now opened so as to isolate the capacitors 212 and 214 from the supply rails and switch 216 is closed so as to connect the top plate of the capacitor 214 to the output node 107. Switch 211 is closed so as to connect the bottom plate of the second charge pump capacitor 214 to the top plate of the first charge pump capacitor 212. Switch 202 is also closed. In effect this causes the capacitors to be placed in series and connected to VDD such that, had switch 216 been open, the voltage on the top plate of the capacitor 214 would have been at 3 VDD. However because switch 216 is closed, the capacitor can deliver charge to the internal storage capacitor 132 to increase the voltage across it. The comparator/amplifier 102 acts in a comparator mode at this time and determines whether the voltage Vref at node 107 has exceeded that of Vref_external. If it has, then no further charge pump action is required, and the circuit can progress to a voltage fine adjustment mode which can be regarded as being a second correction phase as will be described later. However if the voltage at node 107 is still less than that of Vref_external, then a second charge pump dump can be performed which starts, as shown in FIG. 9, with switch 216 being opened so as to disconnect the charge pump from the internal storage capacitor 132. Then the switches 204, 206, 208 and 210 are closed such that each of the first and second charge storage capacitors is recharged to VDD. During this phase, the switch 211 interconnecting the top plate of the first capacitor 212 to the bottom plate of the second capacitor 214 is open, otherwise a short circuit condition would occur between the supply rails. Similarly switch 202 is also open. Then the circuit progresses to make a second charge pump dump, as shown in FIG. 10, by opening switches 204, 206, 208, 210 so as to isolate the capacitors from the supply rail, closing switch 202 so as to connect the bottom plate of the capacitor 212 to VDD, closing switch 211 to connect the top plate of the capacitor 212 to the bottom plate of the capacitor 214 and closing switch 216 such that a second charge dump can be delivered to the internal capacitor 132.

The capacitors 212 and 214 should be sized that a sufficient number of charge pump dumps can be performed in the time allotted to the correction phase in order to recharge the capacitor 132 to a voltage close to Vref_external or exceeding it. By doing this the voltage on the internal storage capacitor has been increased to close to that of the external reference voltage. Operation in the correction phase may occur until either a time limit is reached, a fixed number of cycles has occurred or the voltage on Vref internal has exceeded a threshold as determined by the comparator.

Figure 11:
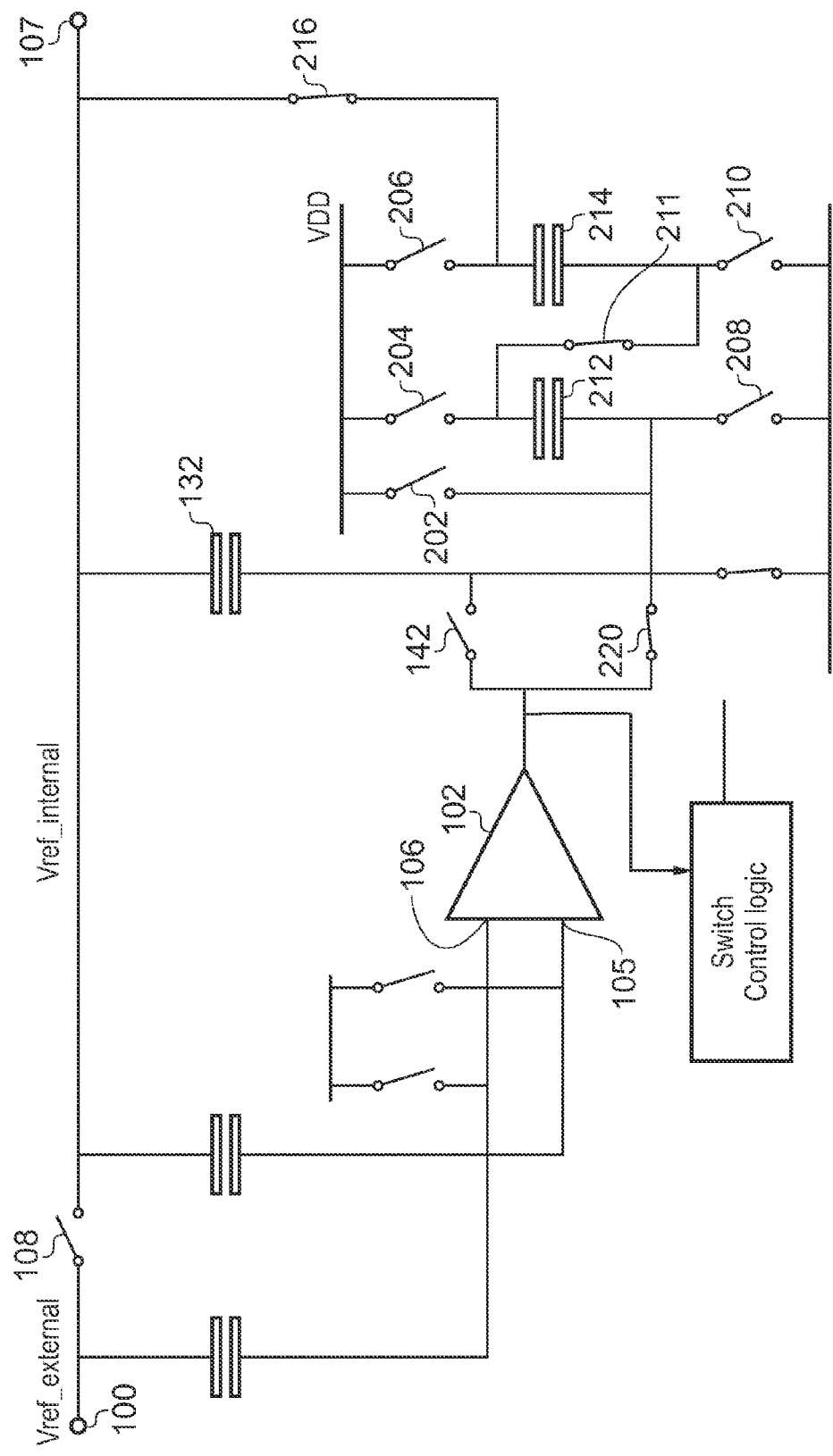
FIG. 11 shows the circuit of FIG. 4 during a second correction phase of operation where the voltage across the reference capacitor is fine tuned.

The circuit may now move on to a second correction phase shown in FIG. 11 where a voltage fine adjustment is performed, and where switch 216 remains closed, switches 204, 206, 208 and 210 remain open as before. However now switch 202 is opened so as to disconnect the bottom plate of the first charge pump capacitor 212 from the supply VDD and the switch 220 is closed thereby connecting the output of the amplifier/comparator 102 to the series connected capacitors 212 and 214 of the charge pump and via switch 216 to the top plate of the internal storage capacitor 132. At this point the amplifier comparator 102 is operating in an amplifier mode and hence a feedback loop is formed. Thus, by the feedback action the amplifier 102 modifies its output voltage in order to bring the voltage at its input 105 to match that of its input 106, and thereby bring Vref at node 107 to match Vref external at node 100. Thus the amplifier has been used to restore the voltage on the capacitor 132 to its correct value. From here switch 216 can now be opened so as to disconnect the charge pump capacitors 212 and 214 from internal capacitor 132. Once this has been done, the switches can then be returned to the switch configurations shown in FIG. 4 to return the circuit to the acquisition phase prior to performing a subsequent conversion. As described, the amplifier output is coupled to Vref_internal via the charge pump capacitors during the second correction phase. Alternatively an additional capacitor, not shown, can be placed directly between the amplifier output and Vref_internal in addition to or instead of the charge pump capacitors to couple the amplifier output to Vref_internal during the second correction phase.

The present invention can be used with many types of charge redistribution converters, such as pipeline converters or hybrid Flash-SAR converter. However, it is evident that it is beneficial for the DAC to take as little current as possible from Vref external 70 when operating.

To this end, the present invention is very suited for use with the capacitive digital to analog converter described by Ronald Kapusta in a patent application (application Ser. No. 13/069, 966, filed Mar. 23, 2011) having the title "Charge Redistribution Digital to Analog Converter". A reservoir capacitor may be split into multiple reservoir capacitors associated with one or more capacitors of the DAC, with such an arrangement being disclosed in FIGS. 4 and 5 of that application, which is incorporated herein by reference in its entirety.

Figure 12:
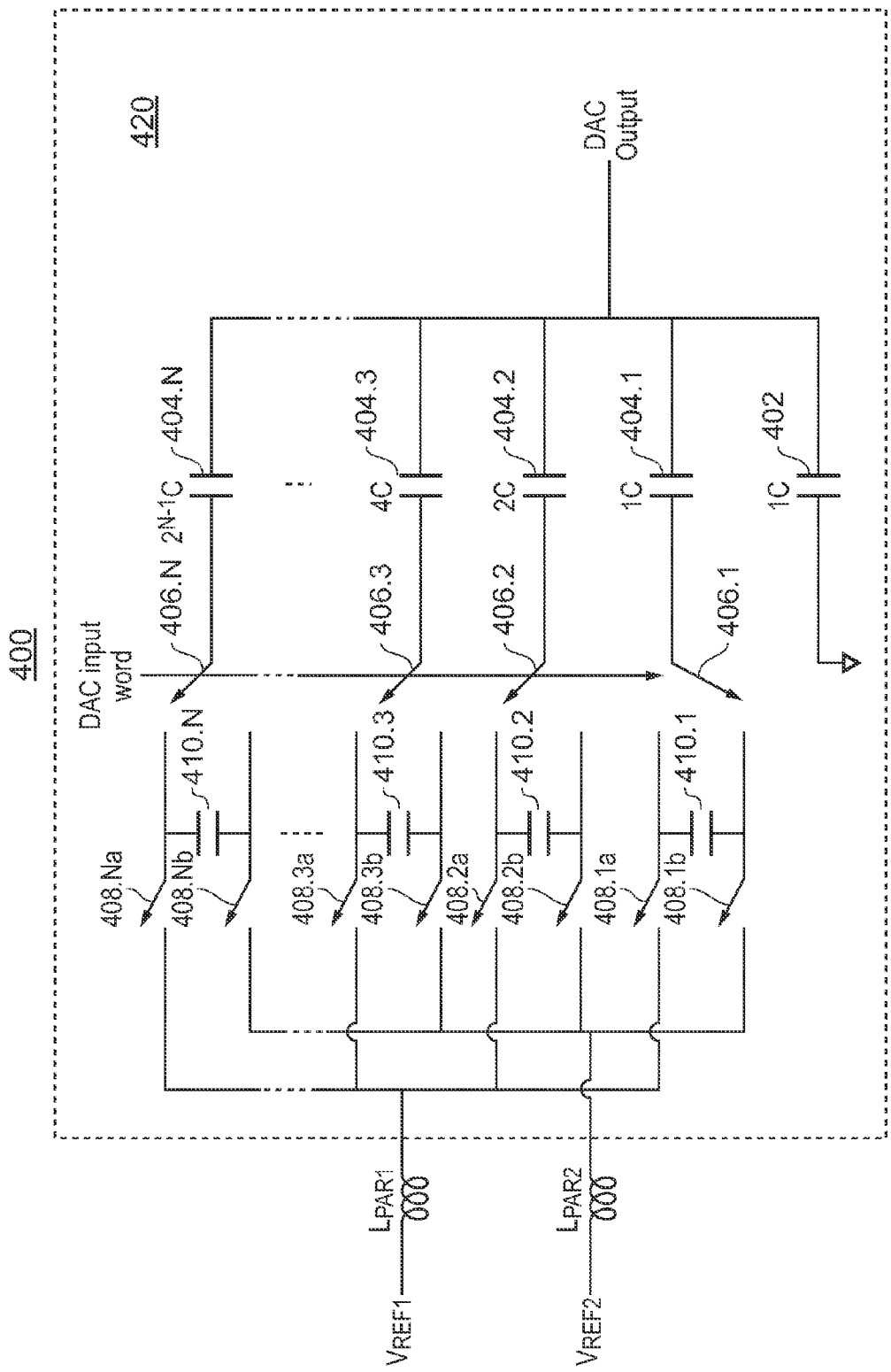
FIG. 12 shows a switched capacitor DAC having multiple storage capacitors, where one or more of the capacitors may be replaced by a reference circuit as described herein, or where one storage capacitor may be shared between some, but not all, of the capacitors of the DAC.

FIG. 12 shows a charge redistribution DAC 400. The charge redistribution DAC 400 may be a N bit DAC and may comprise a terminating capacitor 402 and an array of binary weighted capacitors 404.1-404.N, and a plurality of switches 406.1-406.N. The charge redistribution DAC may further comprise a plurality of reservoir capacitors $C_{RES}$ 410.1-410.N. The reservoir capacitors $C_{RES}$ 410.1-410.N each may have a first side (e.g., a first plate or top plate) and a second side (e.g., a second plate or bottom plate) connected to external terminals for the reference voltages Vref1 and Vref2 via switches 408.1a and 408.1b to 408.Na and 408.Nb respectively. Each DAC capacitor 404 may be controlled by a respective switch 406 to disconnect from a respective reservoir capacitor $C_{RES}$ 410 or connect to either the first side or the second side of the respective reservoir capacitor $C_{RES}$ 410. All of these components of the charge redistribution DAC, for example, the capacitors (402, 404.1-404.N), switches (406.1-406.N, 408.1a and 408.1b to 408.Na and 408.Nb), reservoir capacitors $C_{RES}$ (410.1-410.N), may be integrated on an IC chip 420 (e.g., on the same die), and the reservoir capacitors $C_{RES}$ (410.1-410.N) may be on-chip reservoir capacitors.

The switches 406.1-406.N may be controlled by a N bit DAC input word that may be a binary digital word with each bit controlling a switch. The switch 406.1 may be controlled by the least significant bit (LSB), and thus the capacitor 404.1 may correspond to the LSB and its capacitance may be a unit capacitance (e.g., 1 C). The switch 406.N may be controlled by the most significant bit (MSB) and its capacitance may be $2^{N-1}$ unit capacitance. Thus, the binary weighted capacitors 404.1-404.N have capacitances of $2^0$ C, $2^1$ C, ... and $2^{N-1}$ C respectively.

The charge redistribution DAC 400 may be part of the IC chip 420 and the reference voltages Vref1 and Vref2 may be supplied from outside of the IC chip 420. The charge redistribution DAC 400 may operate in 2 phases. During the first phase, each of the reservoir capacitors $C_{RES}$ 410.1-410.N may be connected to the external reference voltages Vref1 and Vref2 to sample the reference voltages Vref1 and Vref2. During this phase, the switches 408.1a-408.Na may connect the first sides of the reservoir capacitors $C_{RES}$ 410.1-410.N to the external Vref1 and the switches 408.1b-408.Nb may connect the second sides of the reservoir capacitors $C_{RES}$ 410.1410.N to the Vref2. In one embodiment, the switches 406.1-406.N may be kept closed for the DAC capacitors 404.1-404.N to be connected to the reservoir capacitor $C_{RES}$ 410 during the first phase. In another embodiment, the switches 406.1-406.N may disconnect the DAC capacitors 404.1-404.N from the reservoir capacitors $C_{RES}$ 410.1-410.N during the first phase. In the latter embodiment, any ringing due to parasitics may have no effect on any of the DAC capacitors 404.1-404.N.

During the second phase, each of the switches 408.1a-408.Na and 408.1b-408.Nb may be disconnected. Thus, the first and second plates of the reservoir capacitors $C_{RES}$ 410.1-410.N may be disconnected from the outside of the chip 420 (e.g., disconnecting from the external Vref1 and Vref2), and thus isolating charge redistribution DAC 400 from the parasitics. In the second phase, one or more DAC input words may be applied to the switches 406.1-406.N. In each DAC input word, a digital "1" may connect a corresponding DAC capacitor 404 to the first side of a corresponding reservoir capacitor $C_{RES}$ 410 and a digital "0" may connect a corresponding DAC capacitor 404 to the second side of a corresponding reservoir capacitor $C_{RES}$ 410. Therefore, all of the charge redistribution will take place completely on-chip, between the reservoir capacitors $C_{RES}$ 410.1-410.N and the DAC capacitors 404.1-404.N.

In one embodiment, each of the reservoir capacitors 410.1-410.N may be sized differently. The LSB reservoir cap 410.1, connected to the 1 C DAC cap 404.1, may be the smallest because it is subject to the least charge sharing (1 C is the smallest DAC cap) and its significance at the DAC output is also the smallest. The MSB reservoir cap 410.N, connected to the $2^{N-1}$ C DAC cap 404.N, may be the largest because it is subject to the most charge sharing ($2^{N-1}$ C is the largest DAC cap) and its significance at the DAC output is also the largest. Even the largest reservoir capacitor 410.N may have a capacitance much smaller than a single reservoir capacitor. Further, the overall capacitance of 410.1-410.N may be smaller than the capacitance of the single reservoir capacitor.

In another embodiment, the number of reservoir capacitors 410 may be less than the number of DAC capacitors 404. That is, there does not have to have a separate reservoir capacitor for each bit and at least one reservoir capacitor may be shared by two or more DAC capacitors. The charge redistribution DAC may be an example that one reservoir capacitor may be shared by N DAC capacitors.

In one embodiment, not shown, the DAC capacitors of the charge redistribution DAC 400 may be configured in a capacitor split-array.

It is evident that the reference circuit of any of FIGS. 2 to 11 can be used in conjunction with reservoir capacitors 410. For example in one embodiment a reservoir capacitor 410 is connected to the output nodes 107 and 101 of the reference circuit, in which case the switches 408 are not required. In another embodiment the switches 408 connect one or more reservoir capacitors to nodes 107 and 101 of one or more reference circuits. In the latter case one or more switches of a corresponding 408 switch pair are opened prior to changing the state of switches 406 so as to capture an accurate representation of the reference voltage on to the reservoir capacitors 410. This may be done about the same time as switch 108 is first turned off at the beginning of the first conversion phase. The switches 408 will be closed again during the correction phase after conversion is complete to ensure that the reservoir capacitors 410 are substantially recharged before switch 108 is closed so as to minimise the charge taken from the precision reference circuit 70.

Figure 13:
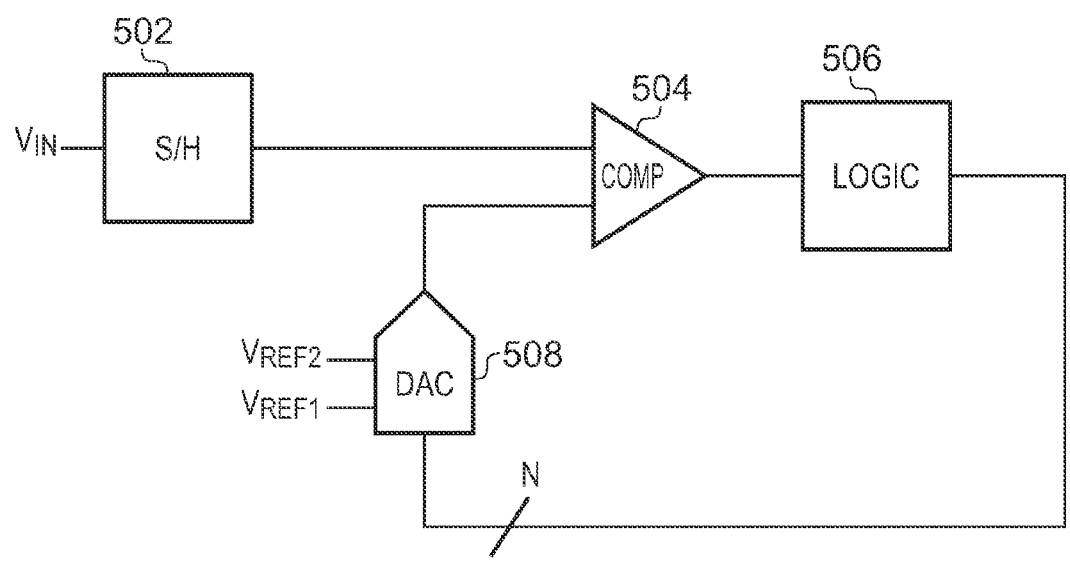
FIG. 13 is a schematic diagram of an analog to digital converter including a charge redistribution DAC.

FIG. 13 shows a SAR ADC 500 with a charge redistribution DAC. The SAR ADC 500 comprises a sample-and-hold circuit (S/H) 502, a voltage comparator 504, an internal N bit DAC 508 and a digital control logic block 506. During operations, the S/H circuit 502 may acquire an input voltage Vin and the analog voltage comparator 504 may compare the input voltage Vin to the output of the internal N bit DAC 508. The result of the comparison may be output to the digital control logic block 506, which may supply an approximate digital code of Vin to the N bit DAC 508. The approximate digital code of Vin may be a N bit control word (e.g., the DAC input word).

The digital control logic block 506 may include a successive approximation register. The SAR ADC 500 may operate as follows. The successive approximation register may be initialized so that the most significant bit (MSB) may be equal to a digital 1. This code may be fed into the DAC 508, which then may supply the analog equivalent of this digital code (e.g., $$\frac{Vref1 - Vref2}{2}$$

into the comparator circuit for comparison with the sampled input voltage Vin. If this analog voltage exceeds Vin the comparator 504 may cause the SAR to reset this bit; otherwise, the bit may be left as 1. Then the next bit may set to 1 and the same test may be performed. This binary search may be continued until every bit in the SAR has been tested. The resulting code may be the digital approximation of the sampled input voltage Vin and may be finally output by the SAR ADC 500 at the end of the conversion (EOC).

The internal N bit DAC 508 of the SAR ADC 500 may be a N bit charge redistribution DAC. Because a SAR makes its bit decisions sequentially in time, improvements to the DAC settling time may have a significant impact on the maximum SAR throughput.

Figure 14:
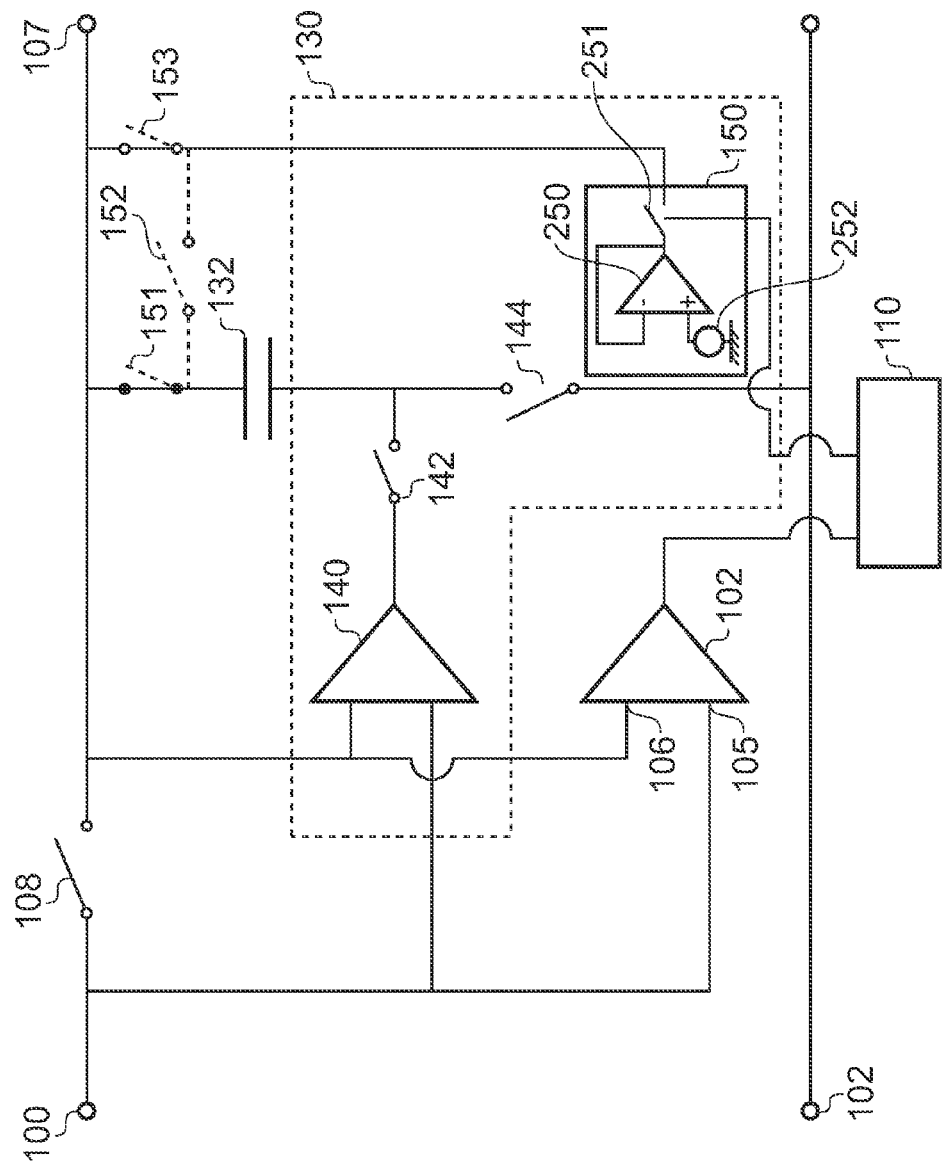
FIG. 14 shows a modification to the circuit shown in FIG. 3.

FIG. 3 had been described with respect to using a charge pump to restore the voltage on the storage capacitor. However, where Vdd is greater that Vref, charge pumps are not required, although they may still be used. FIG. 14 shows an alternative arrangement where the charge pump has been replaced by a voltage follower 250 having its output optionally connectable to node 107 via a switch 251 (alternatively switches 152 and 153 can perform this function). The voltage follower may be implemented as an operational amplifier with unity gain, and receiving a target voltage from a voltage source, such as an internal source 252, or Vref_external from the voltage source 70.

Figure 15:
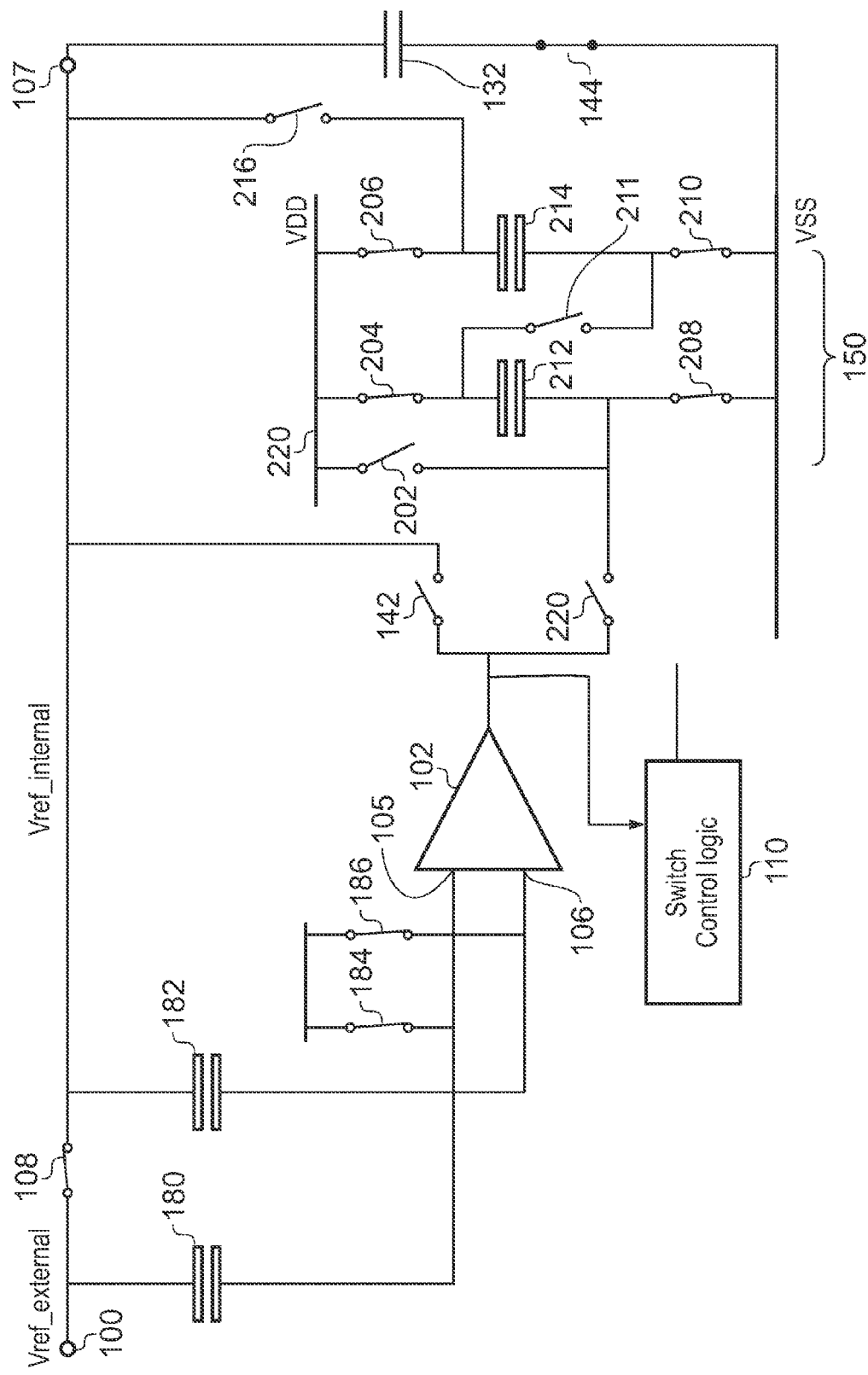
FIG. 15 is a schematic diagram of a circuit constituting a further embodiment of the invention.

In the embodiments described with respect to FIGS. 4 to 11, there was access to the second or bottom plate of the capacitor 132, and it was possible to modify the voltage of that plate of the capacitor 132. This need not always be necessary. It is possible to notionally redraw the circuit diagram of FIG. 4, and to place the storage capacitor as an element 132 connected to the output node 107. The connection via switch 142 is modified, as shown in FIG. 15, to go to the output node 107. Thus the operation of the circuit is very similar to that described with respect to FIGS. 4 to 11, except that the reference circuit cannot operate in the second conversion phase as described with reference to FIG. 6, where the amplifier was able to control the voltage at node 107 via a series connection through the storage capacitor 132. However, in the arrangement shown in FIG. 15, the amplifier operates in a modified second conversion phase where switch 142 is closed and it drives node 107 directly. As a further alternative the amplifier could be arranged to drive the voltage of the output node 107 through the capacitors 212 and 214 of the charge pump. The capacitor 132 may be permanently connected between the output node 107 and a local ground or Vss, or it may have a switch in series with it to enable it to be isolated during some phases of operation of the associated analog to digital converter so as not to load the amplifier 102, thus as shown in FIG. 15 a series switch 144 may be provided. The switch may be provided between the capacitor and ground as shown, or between the capacitor and the output 107.

Figure 16:
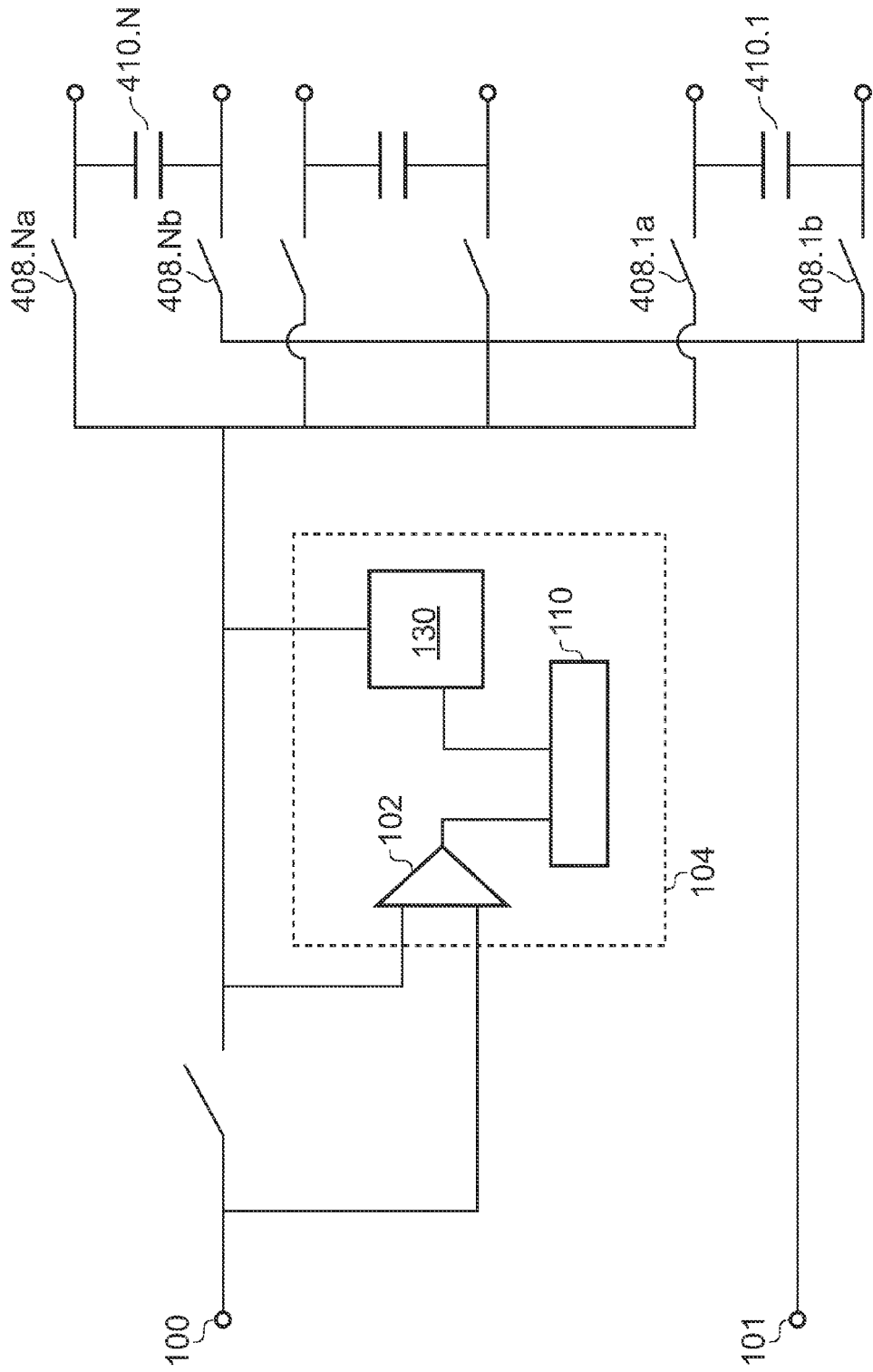
FIG. 16 is a schematic diagram of a further embodiment.

The storage capacitor 132 need not be specifically fabricated. Thus the storage capacitor 132 may be one or more of the capacitors of the switched capacitor array of a DAC or ADC, or may be one of the capacitors 410 of FIG. 12. Such an arrangement is shown in FIG. 16 where the plurality of reservoir capacitors 410.1 to 410.N of FIG. 12 act as a plurality of storage capacitors for the reference circuit. The switches 408.1a,b to 408.Na,b are operable to connect the reservoir (storage) capacitors together, and to the voltage modification circuit during a period between conversions when the voltages of the storage capacitors are to be returned to Vref.

It can be seen that the reference circuit operates in a cyclical manner, in which stages of the cycle of operation can be
- stage 1=an acquisition phase
- stage 2=a first conversion phase
- stage 3=a second conversion phase
- stage 4=a third conversion phase
- stage 5=a correction phase
- stage 6=a second correction phase, and then the cycle is repeated.

It is thus possible to provide an improved ADC. Because the current drawn from the voltage reference 70 has been significantly reduced, the reference 70 can be implemented 'on chip' thereby reducing pin-out overhead.

The invention claimed is:

1. A reference circuit for use with a charge redistribution analog to digital converter having a capacitor array, the reference circuit comprising:
   an input for receiving a signal;
   an output for supplying a reference voltage to at least one capacitor of the capacitor array;
   a storage capacitor for storing the reference voltage;
   a voltage modification circuit for comparing the reference voltage stored on the storage capacitor with the reference signal, and based on the comparison to supply a correction so as to reduce a difference between the reference voltage and the reference signal, the correction being applied during a correction phase; and
   a first switch for selectively connecting the storage capacitor to the input during an acquisition phase.

2. A reference circuit as claimed in claim 1, in which the first switch is operated so as to disconnect the input from the storage capacitor during a first conversion phase, in which the analog to digital converter is arranged to perform a first number "A" of bit trials.

3. A reference circuit as claimed in claim 2, in which the storage capacitor is connected to the output during the first conversion phase.

4. A reference circuit as claimed in claim 1, in which the first switch is open during a second conversion phase in which the analog to digital converter converts a plurality "B" of bit trials, and in which a first terminal of the storage capacitor is connected to the output.

5. A reference circuit as claimed in claim 4, in which the voltage modification circuit comprises an amplifier arranged to form an amplifier output signal as a function of a difference between the reference voltage and the reference signal, and to supply the amplifier output signal to a second terminal of the storage capacitor during the second conversion phase.

6. A reference circuit as claimed in claim 5, in which a switch arrangement is arranged to provide the amplifier output signal as the correction signal to the second terminal of the storage capacitor during the second conversion phase.

7. A reference circuit as claimed in claim 5, in which level shifting capacitors are provided between the input for receiving the reference signal and the first input of the amplifier; and between the output for supplying the reference voltage and the second input of the amplifier.

8. A reference circuit as claimed in claim 7, in which the amplifier is adaptable to function as a comparator.

9. A reference circuit as claimed in claim 1, in which the voltage modification circuit comprises an amplifier arranged to form an amplifier output signal as a function of a difference between the reference voltage and the reference signal, and to supply the amplifier output signal to the first terminal of the storage capacitor during the second conversion phase.

10. A reference circuit as claimed in claim 9, in which a switch is arranged to provide the amplifier output signal as the correction signal to the first terminal of the storage capacitor during the second conversion phase.

11. A reference circuit as claimed in claim 1, in which during a third conversion phase the storage capacitor has one of its plates isolated so as to effectively disconnect it and the first switch is closed.

12. A reference circuit as claimed in claim 11, in which the second plate of the storage capacitor is isolated.

13. A reference circuit as claimed in claim 1, in which the output voltage modification circuit further comprises a voltage, current or charge supply circuit connected to the first terminal of the storage capacitor.

14. A reference circuit as claimed in claim 13, in which a voltage, current, or charge is supplied to the first terminal of the storage capacitor during the correction phase so as to reduce the difference between the reference signal and the reference voltage.

15. A reference circuit as claimed in claim 13, further comprising a second switch arranged to connect the second terminal of the storage capacitor to a common rail during the correction phase.

16. A reference circuit as claimed in claim 13, in which the charge supply circuit comprises a charge pump.

17. A reference circuit as claimed in claim 16, in which the charge pump can be operated for a plurality of charge pump cycles to inject charge into the storage capacitor.

18. A reference circuit as claimed in claim 16, operable in a second correction phase to connect an amplifier output in series with capacitors of the charge pump or other capacitors so coupling the amplifier output to the output of the reference circuit, and in a feedback loop in which the reference voltage is compared with the reference signal by the amplifier inputs so as to reduce a difference therebetween.

19. A reference circuit as claimed in claim 13, where the current or voltage supply circuit draws current directly from a supply or ground through a variable or switchable active device.

20. A reference circuit as claimed in claim 13, in which the correction phase continues until the difference between the reference signal and the reference voltage is less than a predetermined threshold.

21. A reference circuit as claimed in claim 1, in which the reference circuit operates in a cyclical manner.

22. A reference circuit as claimed in claim 1, in which the reference circuit includes at least one of a comparator and an operational amplifier arranged to undergo an auto-zero operation.

23. A reference circuit as claimed in claim 22, in which the at least one comparator or operational amplifier undergoes the auto-zero operation after the acquisition phase.

24. A reference circuit as claimed in claim 1, the output voltage modification circuit comprising a comparator having inputs arranged to receive the reference signal and the reference voltage, or level shifted representations thereof.

25. A reference circuit as claimed in claim 24, in which level shifting capacitors are provided between the input for receiving the reference signal and the first input of the comparator; and between the output for supplying the reference voltage and the second input of the comparator.

26. A reference circuit as claimed in claim 1, comprising a plurality of storage capacitors in association with an output switch arrangement configured to connect respective first terminals of the plurality of storage capacitors to the output during the correction phase.

27. A reference circuit as claimed in claim 26, in which the output switch arrangement is further configured to connect respective first terminals of the plurality of storage capacitors to the input during the acquisition phase or to the output when the output is connected to the input by way of the first switch.

28. A reference circuit as claimed in claim 27 in which the second plates of the capacitors are connected to a second reference, such as ground or Vss during the correction and acquisition phases.

29. An analog to digital converter including a reference circuit as claimed in claim 26, in which said plurality of storage capacitors function as a plurality of reservoir capacitors.

30. An analog to digital converter as claimed in claim 29, having a reservoir capacitor per switched capacitor of a capacitor array within the analog to digital converter.

31. An analog to digital converter as claimed in claim 30, where one or more reservoir capacitors are connectable to the output of one or more reference circuits.

32. An analog to digital converter including a reference circuit as claimed in claim 1, further comprising a flash or mini-ADC to convert a plurality of the most significant bits of a converter output word.

33. An analog to digital converter including a reference circuit as claimed in claim 1, wherein the analog to digital converter and the reference circuit are on the same integrated circuit.

34. A method of providing a reference voltage to an analog to digital converter having a charge redistribution capacitor array, the method comprising: receiving at an input a reference signal voltage from a reference circuit; providing a reference output voltage to at least one capacitor of the capacitor array; comparing the reference output voltage with the reference signal voltage, and based on the comparison, supplying a correction signal to reduce the difference between the reference output voltage and the reference signal voltage, the correction being supplied during a correction phase; and connecting a storage capacitor to the input during an acquisition phase so as to store the reference signal voltage thereon.

35. An integrated circuit comprising a reference circuit in combination with a charge redistribution DAC having a plurality of capacitors within a switched capacitor array, the reference circuit comprising: an input for receiving an input voltage from a voltage source, an output for supplying a reference circuit output voltage to the DAC; a storage capacitor for storing a reference voltage; and a voltage modification circuit for causing an output voltage from the reference circuit stored on the storage capacitor to substantially equal the input voltage, said voltage modification circuit operating during a correction phase; and a switch for connecting the storage capacitor to the input during the acquisition phase.

* * * * *